(12) United States Patent
Yun et al.

(10) Patent No.: US 9,680,074 B2
(45) Date of Patent: Jun. 13, 2017

(54) OPTICAL DEVICE AND LIGHT EMITTING DEVICE PACKAGE INCLUDING THE SAME

(71) Applicant: SAMSUNG ELECTRONICS CO., LTD., Suwon-si (KR)

(72) Inventors: Ji Hoon Yun, Seoul (KR); Jong Sup Song, Hwaseong-si (KR); Soo Hwan Lee, Suwon-si (KR); Saesil Kim, Suwon-si (KR); Mi Jeong Yun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/058,645

(22) Filed: Mar. 2, 2016

(65) Prior Publication Data

US 2016/0380169 A1    Dec. 29, 2016

(30) Foreign Application Priority Data

Jun. 26, 2015    (KR) .................. 10-2015-0091401

(51) Int. Cl.
*H01L 33/00* (2010.01)
*H01L 33/58* (2010.01)
*F21V 3/02* (2006.01)
*H01L 33/24* (2010.01)
*H01L 33/38* (2010.01)
*H01L 33/50* (2010.01)

(52) U.S. Cl.
CPC ............. *H01L 33/58* (2013.01); *F21V 3/02* (2013.01); *H01L 33/24* (2013.01); *H01L 33/382* (2013.01); *H01L 33/505* (2013.01); *H01L 2933/0058* (2013.01)

(58) Field of Classification Search
CPC . H01L 33/0004–33/648; G02B 13/002; G02B 6/02371; G02B 6/02338; G02B 3/02–3/04; G02B 7/027; G02B 13/005; G02B 13/18
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |

(Continued)

FOREIGN PATENT DOCUMENTS

| | | |
|---|---|---|
| JP | 2010-50236 A | 3/2010 |
| JP | 5025612 B2 | 9/2012 |

(Continued)

*Primary Examiner* — Cuong B Nguyen
(74) *Attorney, Agent, or Firm* — Sughrue Mion, PLLC

(57) ABSTRACT

An optical device may include a first surface having a shape of a quadrangle; and a second surface disposed to be opposite to the first surface and comprising a convex curved surface. The optical device has an aspherical shape in a cross-section taken along a diagonal direction of the quadrangle and has a semicircular shape in a cross-section taken along a direction connecting a central portion of a first side of the quadrangle and a central portion of a second side opposite to the first side of the quadrangle. In a cross-sectional view of the optical device, the second surface is continuously varied between the semicircular shape of the cross-section and the aspherical shape of the cross-section.

20 Claims, 22 Drawing Sheets

(56) References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,431,942 B2 | 4/2013 | Butterworth |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2003/0067761 A1* | 4/2003 | Horiuchi .............. H01L 33/54 362/601 |
| 2006/0231852 A1 | 10/2006 | Kususe et al. |
| 2007/0153394 A1* | 7/2007 | Soyama .............. G02B 3/0043 359/620 |
| 2014/0027795 A1 | 1/2014 | Reiherzer et al. |
| 2015/0145406 A1* | 5/2015 | Li ....................... F21V 3/0481 313/502 |

FOREIGN PATENT DOCUMENTS

| | | |
|---|---|---|
| KR | 10-0845041 B1 | 7/2008 |
| KR | 20-2011-0007306 U | 7/2011 |
| KR | 10-1370963 B1 | 3/2014 |

* cited by examiner

OPTICAL DEVICE AND LIGHT EMITTING DEVICE PACKAGE INCLUDING THE SAME

CROSS-REFERENCE TO RELATED APPLICATION

This application claims the priority from Korean Patent Application No. 10-2015-0091401 filed on Jun. 26, 2015, with the Korean Intellectual Property Office, the disclosure of which is incorporated herein by reference in its entirety.

BACKGROUND

Apparatuses consistent with example embodiments relate to an optical device and a light emitting device package including the same.

In the related art, a lens used in a light emitting device package may have a hemispherical shape. Conversely, because an LED chip has a quadrangular shape, an angle of incidence of light may be increased in a direction away from a central portion of the LED chip. In particular, in accordance with a structure in which the angle of incidence exceeds a critical angle in a portion adjacent to a corner of the LED chip, total internal reflection (TIR) may occur, thereby leading to optical loss.

This is due to a difference in structures of the LED chip and the lens, and in order to prevent the optical loss, a method of enlarging a size of the lens to adjust an angle of incidence has been used. However, in accordance with an increase in the size of the lens, the implementation of miniaturization may not be easily accomplished to increase the optical efficiency. Therefore, there is limitation in minimizing a high-capacity package using a large-area chip.

SUMMARY

One or more example embodiments may provide a solution allowing for the miniaturization of a high-capacity package using a large-area chip while significantly reducing optical loss.

According to an aspect of an example embodiment, an optical device of a dome structure may include: a first surface having a shape of a quadrangle and a second surface disposed to be opposite to the first surface and having a convex curved surface, wherein the optical device has an aspherical shape in a cross-section in a diagonal direction of the quadrangle and has a semicircular shape in a cross-section in a direction connecting central portions of two facing sides of the quadrangle, and the second surface is continuously varied between the semicircular shape of the cross-section and the aspherical shape of the cross-section.

The optical device may further include: a third surface disposed between the first surface and the second surface and connecting the first surface and the second surface to each other, wherein the third surface extends from an edge of the first surface in an upward direction and is connected to an edge of the second surface.

According to an aspect of another example embodiment, a light emitting device package may include: a substrate having a light source; and an optical device disposed on the substrate to cover the light source, wherein the optical device has a dome structure and includes a first surface having a shape of a quadrangle and a second surface disposed to be opposite to the first surface and having a convex curved surface, the optical device has an aspherical shape in a cross-section in a diagonal direction of the quadrangle and has a semicircular shape in a cross-section in a direction connecting central portions of two facing sides of the quadrangle, and the second surface is continuously varied between the semicircular shape of the cross-section and the aspherical shape of the cross-section.

The second surface may include: a flange part having a concave curved surface extending from an edge of the second surface toward an optical axis of the light source; and a lens part extending from an edge of the flange part and having a convexly protruding central portion through which the optical axis passes.

The second surface may have an inflection point at a connection point of the lens part and the flange part.

In the second surface, a boundary line between the lens part and the flange part may have a quadrangular shape in which it is continuously connected along a perimeter of the second surface, and the boundary line and a corner connected to the boundary line may have a curved surface.

The lens part may include a curved section in which the aspherical shape of the cross-section is disposed above the light source and a linear section disposed between the curved section and the flange part.

The linear section may at least not be disposed on an upper portion of the light source.

The light emitting device package may further include: a third surface disposed between the first surface and the second surface and connecting the first surface and the second surface to each other, wherein in an edge of the substrate, the third surface extends from an edge of the first surface and is connected to an edge of the second surface.

The third surface may be coplanar with respect to a side surface of the substrate.

The light source may include a light emitting device emitting light and a wavelength conversion layer converting a wavelength of light emitted by the light emitting device.

The wavelength conversion layer may cover an upper surface of the light emitting device and may have a cross-sectional area corresponding to or greater than that of the upper surface of the light emitting device.

The wavelength conversion layer may contain at least one or more phosphors.

The light emitting device package may further include: a reflective part covering perimeters of side surfaces of the light emitting device.

The reflective part may have at least a height corresponding to a height of the light emitting device mounted on the substrate.

According to an aspect of another example embodiment, an optical device may include: a first surface having a shape of a quadrangle; and a second surface disposed to be opposite to the first surface and comprising a convex curved surface, wherein the optical device may have an aspherical shape in a cross-section taken along a diagonal direction of the quadrangle and has a semicircular shape in a cross-section taken along a direction connecting a central portion of a first side of the quadrangle and a central portion of a second side opposite to the first side of the quadrangle, and wherein in a cross-sectional view of the optical device, the second surface may be continuously varied between the semicircular shape of the cross-section and the aspherical shape of the cross-section.

The second surface may be continuously varied between the semicircular shape of the cross-section and the aspherical shape of the cross-section along a circumference of the optical device.

The optical device may further include a third surface disposed between the first surface and the second surface and connecting the first surface and the second surface to each other, wherein the third surface may extend from an end portion of the first surface in a first direction and is connected to an end portion of the second surface.

The first direction may extend in a direction substantially perpendicular to an extending direction of the first surface.

The second surface may include: a flange part having a concave curved surface extending from an end portion of the second surface toward an optical axis of the light source; and a lens part extending from an end of the flange part and having a convexly protruding central portion through which the optical axis passes.

The lens part may include: a curved section having the aspherical shape of the cross-section disposed above the light source; and a linear section disposed between the curved section and the flange part, and wherein at least a portion of the linear section is disposed above an upper portion of the light source.

According to an aspect of another example embodiment, a light emitting device package may include: a substrate; a light source provided on the substrate; and an optical device disposed on the substrate to cover the light source, wherein the optical device may have a dome structure and may include: a first surface having a shape of a quadrangle; and a second surface disposed to be opposite to the first surface and having a convex curved surface, wherein the optical device may have an aspherical shape in a cross-section in a diagonal direction of the quadrangle and has a semicircular shape in a cross-section taken along a direction connecting a central portion of a first side of the quadrangle and a central portion of a second side opposite to the first side of the quadrangle, and wherein in a cross-sectional view of the optical device, the second surface is continuously varied between the semicircular shape of the cross-section and the aspherical shape of the cross-section.

The second surface may be continuously varied between the semicircular shape of the cross-section and the aspherical shape of the cross-section along a circumference of the optical device.

The second surface may include: a flange part having a concave curved surface extending from an end portion of the second surface toward an optical axis of the light source; and a lens part extending from an end of the flange part and having a convexly protruding central portion through which the optical axis passes.

The second surface may include an inflection point at a connection point of the lens part and the flange part in a cross-sectional view of the second surface.

In the second surface, a boundary line may extend along a plurality of connection points of the lens part and the flange part has a quadrangular shape, the boundary line continuously extending along a perimeter of the second surface, and wherein the boundary line may include a curved edge line and a corner portion of the boundary line comprises a curved corner line.

The lens part may include: a curved section having the aspherical shape of the cross-section disposed above the light source; and a linear section disposed between the curved section and the flange part.

At least a portion of the linear section may be disposed above an upper portion of the light source.

The light emitting device package may further include a third surface disposed between the first surface and the second surface and connecting the first surface and the second surface to each other, wherein along an outermost edge of the substrate, the third surface may extend from an end portion of the first surface and is connected to an end portion of the second surface.

The third surface may be coplanar with a side surface of the substrate extending in a thickness direction of the substrate.

The light source may include: a light emitting device configured to emit light; and a wavelength conversion layer configured to convert a wavelength of the light emitted by the light emitting device.

The wavelength conversion layer covers an upper surface of the light emitting device and has a cross-sectional area corresponding to or greater than that of an upper surface of the light emitting device.

The wavelength conversion layer may include at least one or more phosphors.

The light emitting device package may further include a reflective part covering perimeters of side surfaces of the light emitting device.

A height of the reflective part is greater than or equal to a height of the light emitting device mounted on the substrate.

BRIEF DESCRIPTION OF DRAWINGS

The above and/or other aspects, features and advantages of the disclosure will be more clearly understood from the following detailed description taken in conjunction with the accompanying drawings, in which.

DETAILED DESCRIPTION

Figure 1:
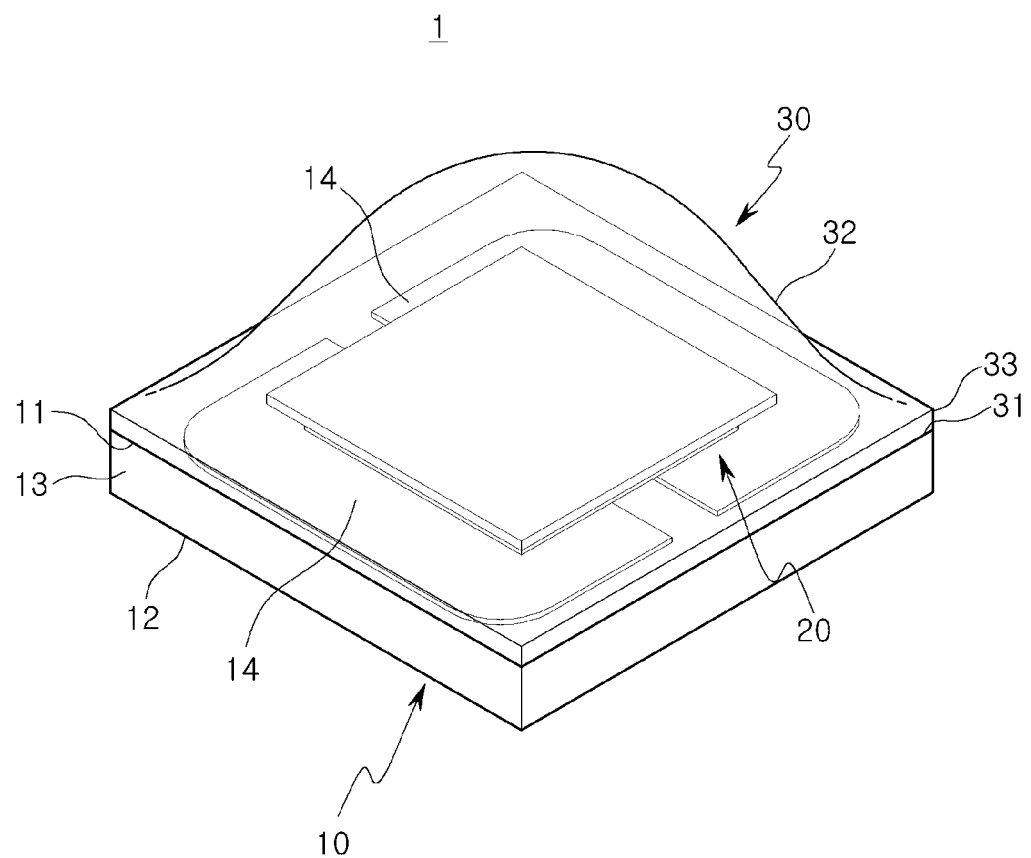
FIG. 1 is a perspective view of a light emitting device package according to an example embodiment.

Example embodiments of the present inventive concept will now be described in detail with reference to the accompanying drawings.

The inventive concept of the disclosure may, however, be exemplified in many different forms and should not be construed as being limited to the specific example embodiments set forth herein. Rather, the example embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

In the specification, the terms 'above', 'upper portion', 'upper surface', 'below' 'lower portion', 'lower surface', 'side or lateral surface' and the like, are used based on the directionality of the drawings, and may actually be different depending on a direction in which a component is disposed.

Figure 2:
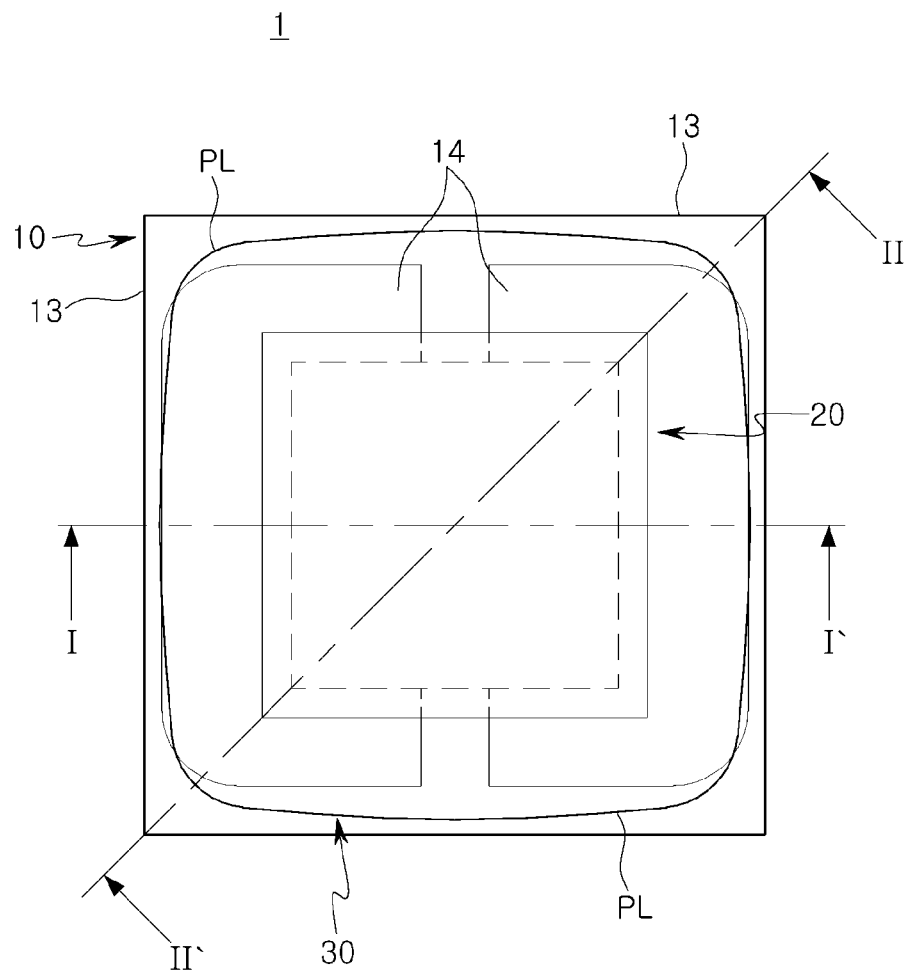
FIG. 2 is a plan view of FIG. 1.

Referring to FIG. 1 and FIG. 2, an optical device 30 and a light emitting device package 1 including the same according to an example embodiment will be described. FIG. 1 is a perspective view of a light emitting device package 1 according to an example embodiment. FIG. 2 is a plan view of FIG. 1.

Referring to FIG. 1 and FIG. 2, a light emitting device package 1 according to an example embodiment may include a substrate 10, a light source 20 disposed on the substrate 10, and an optical device 30 disposed on the substrate 10 and covering the light source 20.

The substrate 10 may contain a semiconductor material such as silicon (Si), a ceramic material such as AN and $Al_2O_3$, a metal material or a polymer material. The substrate 10 may be a printed circuit board (PCB), for example, an FR4-type PCB or a flexible PCB which may be easily deformed.

The substrate 10 may have a quadrangular structure having four side surfaces 13. However, the structure of the substrate 10 according to an example embodiment is merely provided by way of example, and is not limited thereto. The substrate 10 may be variously structured to correspond to a structure of a product or module mounted thereon.

The substrate 10 may have an upper surface 11 on which the light source 20 is mounted and a lower surface 12 opposed to the upper surface 11.

Upper electrodes 14 may be disposed on the upper surface 11 to be electrically connected to the light source 20. Lower electrodes 15 (See FIG. 3) may be disposed on the lower surface 12 to be electrically connected to an external power source. Through-electrodes 16 penetrating through the upper surfaces 11 and the lower surfaces 12 may be disposed within the substrate 10 to connect the upper electrodes 14 and the lower electrodes 15 to each other.

According to a material of the substrate 10, an insulating layer (not shown) may be further interposed between the upper electrodes 14, the lower electrodes 15, and the through-electrodes 16, and the substrate 10. The insulating layer may be formed of a material having electrical insulating properties, for example, a resin. The insulating layer may electrically insulate the substrate 10 from the electrodes 14, 15 and 16. Thus, when the substrate 10 is formed of an insulating material, the insulating layer may be omitted.

The light source 20 may be mounted on the upper surface 11 of the substrate 10 and may be electrically connected to the upper electrodes 14. The light source 20 may include a light emitting device 21 and a wavelength conversion layer 22 converting a wavelength of light emitted by the light emitting device 21.

The light emitting device 21 may be a opto-electronic device generating light having a predetermined wavelength by externally applied driving power. For example, the light emitting device 21 may include a semiconductor light emitting diode (LED) including an n-type semiconductor layer and a p-type semiconductor layer, and an active layer interposed therebetween.

The light emitting device 21 may emit blue light, green light or red light and alternatively, may emit ultraviolet light or the like. If necessary, the light emitting device 21, in conjunction with the wavelength conversion layer 22, may emit white light. A more detailed example of the light emitting device 21 will be described later.

The wavelength conversion layer 22 may cover the light emitting device 21 and may convert a wavelength of light emitted by the light emitting device 21. The wavelength conversion layer 22 may have a thin film shaped structure and may be attached to an upper surface of the light emitting device 21.

The optical device 30 may be disposed on the substrate 10 to cover the light source 20. For example, the light source 20 may be disposed within the optical device 30 while being encapsulated into the optical device 30.

The optical device 30 may have, for example, a dome structure in which an edge thereof contacting an upper surface of the substrate 10 has a quadrangular shape. That is, the optical device 30 may generally have a quadrangular structure when viewed from the above. In addition, the optical device 30 may have an aspherical shape in a cross-section in a direction of a diagonal line connecting two facing corners of the quadrangle, and may have a semicircular shape in a cross-section in a direction connecting central portions of two facing sides of the quadrangle.

In detail, the optical device 30 may include a first surface 31 contacting the upper surface 11 of the substrate 10 and a second surface 32 disposed to be opposite to the first surface 31. In addition, the optical device 30 may further include a third surface 33 connecting the first surface 31 and the second surface 32 to each other.

In the example embodiment, the first surface 31 may correspond to a bottom surface of the optical device 30 and may contact the upper surface 11 of the substrate 10. The first surface 31 may have a shape corresponding to the shape of the substrate 10. For example, the first surface 31 may contact four sides 13 of the substrate 10 along the edge of the substrate 10.

The second surface 32 corresponding to a light emitting surface disposed to be opposite to the first surface 31 and from which light of the light source 20 is emitted outwardly, may correspond to a top surface of the optical device 30. The second surface 32 may generally have a dome shape in a cross-sectional view of the optical device 30 in which the second surface 32 protrudes convexly in an upward direction (i.e., away from the substrate 10) in which light is emitted.

Figure 3:
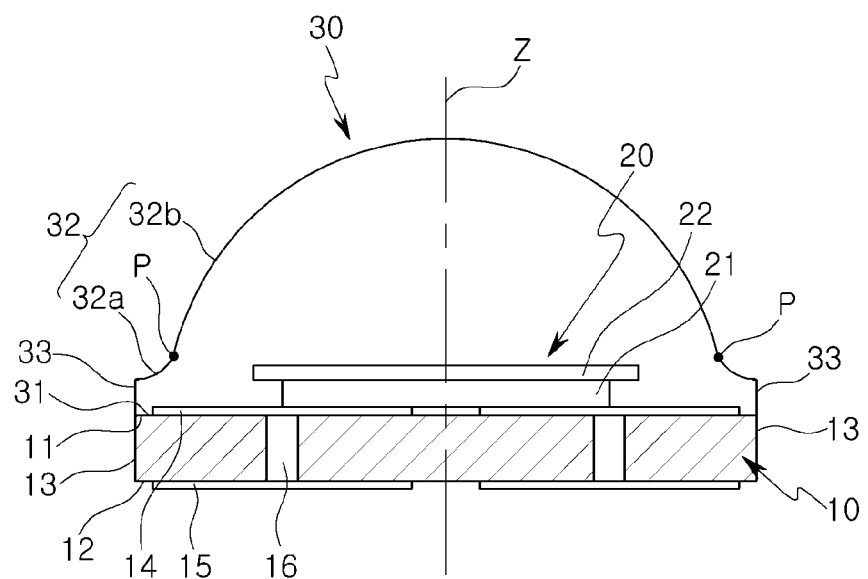
FIG. 3 is a cross-sectional view of the light emitting device package illustrated in FIG. 2, taken along line I-I'.

FIG. 3 is a cross-sectional view of the light emitting device package 1 illustrated in FIG. 2, taken along line I-I'.

As illustrated in FIG. 3, the second surface 32 may define a protruding surface having the semicircular cross-section, of the optical device 30.

In detail, the second surface 32 may have a flange part 32a having a concavely curved surface extending from an edge of the second surface 32 connected to the third surface 33 toward an optical axis Z of the light source 20, and a lens part 32b extending from an edge of the flange part 32a and having a convexly protruding central portion through which the optical axis Z passes. Thus, the semicircular cross-section of the second surface 32 may correspond to a cross-section of the lens part 32b except for the flange part 32a of the second surface 32.

Meanwhile, the second surface 32 may have inflection points P at connection points provided between the convex lens part 32b and the concave flange part 32a.

Referring back to FIG. 2, when viewed from the above, connecting the inflection points P shown in FIG. 3 may define a boundary line PL between the lens part 32b and the flange part 32a along a perimeter of the second surface 32. In addition, the boundary line PL formed by the inflection points P may have a quadrangular shape in which the boundary line PL is continuously connected along the perimeter of the second surface 32.

The boundary line PL forming four surfaces of the quadrangle shape may have gentle curved lines. In addition, respective connection edges of the boundary line PL may have curved lines. That is, the edges of the boundary line PL may have a generally rounded, quadrangular shape, rather than a quadrangular shape formed by straight lines and forming right angles.

Figure 4:
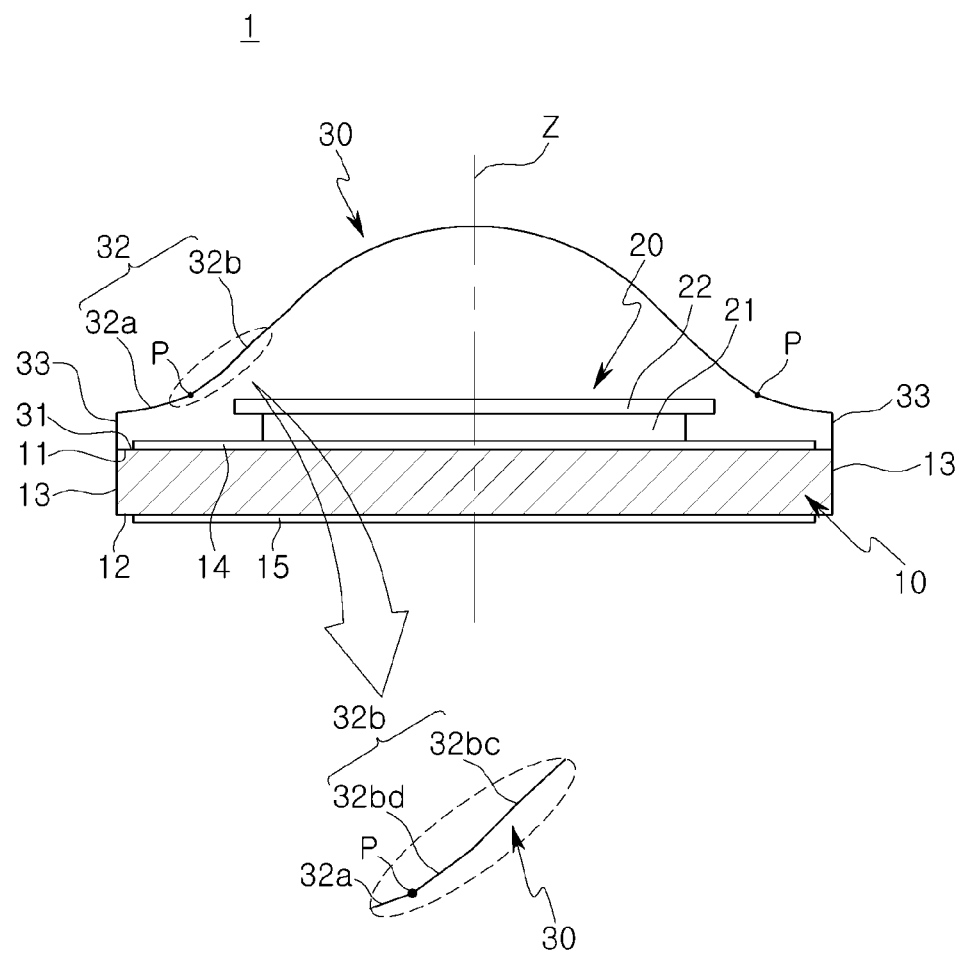
FIG. 4 is a cross-sectional view of the light emitting device package illustrated in FIG. 2, taken along line II-II'.

FIG. 4 is a cross-sectional view of the light emitting device package 1 illustrated in FIG. 2, taken along line II-II'.

As illustrated in FIG. 4, the second surface 32 may define a protruding surface having the aspherical cross-section of the optical device 30. Similarly, the aspherical shape of the second surface 32 may correspond to a cross-section of the lens part 32b except for the flange part 32a of the second surface 32.

The lens part 32b may include a curved section 32bc of the aspherical cross section which is disposed above the light source 20 and a linear section 32bd disposed between the curved section 32bc and the flange part 32a. The linear section 32bd may not be disposed on an upper portion of the light source 20. The linear section 32bd may reduce an angle of incidence of the light source 20 in the curved section 32bc, specifically, an angle of incidence of light from the corners of the light emitting device 21, to an angle smaller than a critical angle.

The curved section 32bc may have the radius of curvature substantially corresponding to the radius of curvature of the semicircular cross-section. The linear section 32bd may connect the curved section 32bc and the flange part 32a to each other at a gentle slope.

Because a hemispherical lens according to the related art has a cross-sectional structure having almost right angle at corner portions of an LED chip, an angle of incidence may be greater than a critical angle. However, the example embodiment of FIGS. 1 through 4 may have a cross-sectional structure having a gentle slope by the linear section 32bd. Therefore, unlike the lens structure according to the related art, the occurrence of optical loss due to total internal reflection may be prevented to result in effects such as improvements in light extraction efficiency. In particular, because it is unnecessary to enlarge a size of the lens (i.e., the optical device) in order to prevent the occurrence of optical loss, it is appropriate to implement a high efficiency package having a compact size using a large chip.

Meanwhile, the second surface 32 may be continuously and alternately varied between the semicircular shape of the cross-section and the aspherical shape of the cross-section in a diagonal direction along a circumference of the optical device. That is, in a cross-sectional view of the second surface 32, the cross-sectional view of the second surface 32 changes back and forth between the semicircular shape of the cross-section and the aspherical shape of the cross-section along the circumference of the optical device.

The third surface 33 may be disposed between the first surface 31 and the second surface 32 and may connect an edge of the first surface 31 and an edge of the second surface 32. In detail, in the edge of the substrate 10, the third surface 33 may extend substantially perpendicularly from the end of the first surface 31 in an upward direction and may be connected to the end of the second surface 32 as shown in FIGS. 3 and 4.

The third surface 33 may at least extend at a height corresponding to a height of the light source 20. In addition, the third surface 33 may have a structure in which the third surface 33 is coplanar with respect to the respective side surfaces 13 of the substrate 10.

The optical device 30 may be formed of a resin material having light-transmissive properties, for example, polycarbonate (PC), polymethyl methacrylate (PMMA), an acrylic material, or the like. In addition, the optical device 30 may be formed of a glass material, but the example embodiment is not limited thereto.

The optical device 30 may contain a light dispersion material in a range of about 3% to about 15%. The light dispersion material may include at least one selected from a group consisting of $SiO_2$, $TiO_2$ and $Al_2O_3$. In a case in which the light dispersion material is included in an amount of less than 3%, light may not be sufficiently dispersed and thus, sufficient light dispersion effects may not be expected. In a case in which the light dispersion material is included in an amount of more than 15%, a quantity of light emitted outwardly through the optical device 30 may be reduced to thereby degrade light extraction efficiency.

The optical device 30 may be formed by a scheme of injecting a liquid solvent into a mold to be solidified. For example, the scheme may include an injection molding method, a transfer molding method, a compression molding method and the like.

Figure 5:
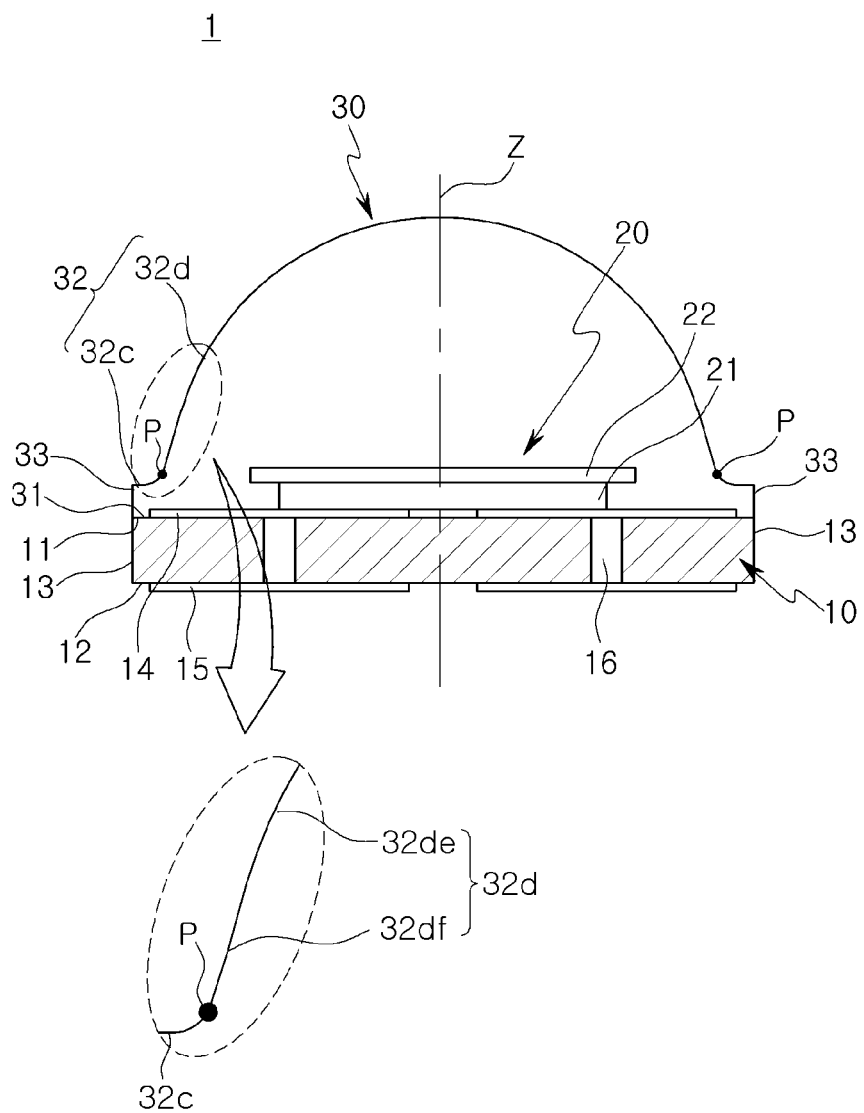
FIG. 5 is a cross-sectional view schematically illustrating a modified example of an optical device illustrated in FIG. 3.
Figure 6:
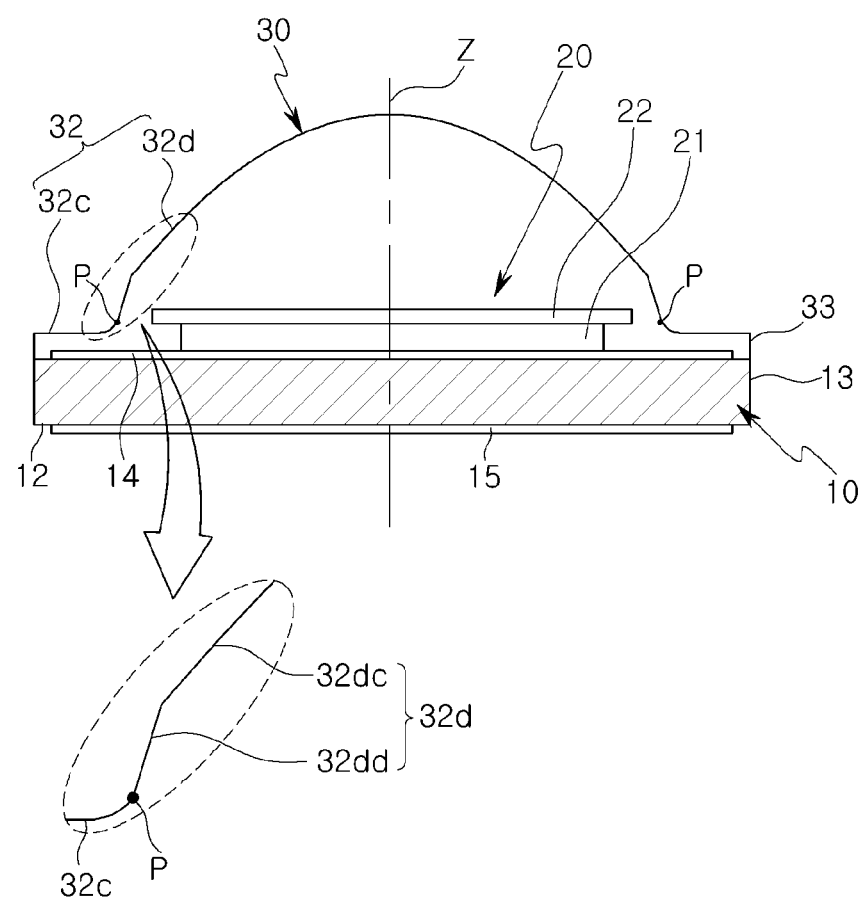
FIG. 6 is a cross-sectional view schematically illustrating a modified example of an optical device illustrated in FIG. 4.

With reference to FIG. 5 and FIG. 6, modified examples of the optical device are explained. FIG. 5 and FIG. 6 are cross-sectional views schematically illustrating modified examples of the optical device 30. That is, FIG. 5 is a view of the light emitting device package 1 illustrated in FIG. 2, taken along line I-I'. FIG. 6 is a view of the light emitting device package 1 illustrated in FIG. 2, taken along line II-II'.

The optical device 30 of the light emitting device package 1 according to the example embodiment is substantially identical to that of the foregoing embodiment with only differences in a structure of the second surface. In detail, the optical device 30 may have an aspherical shape in a cross-section in a direction of a diagonal line connecting two facing corners of the quadrangle, and may have an aspherical shape in a cross-section in a direction connecting central portions of two facing sides of the quadrangle. Therefore, the second surface 32 may define a protruding surface having the aspherical cross-section, of the optical device 30.

As illustrated in FIG. 5 and FIG. 6, the second surface 32 of the optical device 30 may have a flange part 32c and a lens part 32d extending from an edge of the flange part 32c and having a convexly protruding central portion through which the optical axis Z passes. Thus, the aspherical shape of the second surface 32 may correspond to a cross-section of the lens part 32d except for the flange part 32c of the second surface 32.

Referring to FIG. 5, the lens part 32d may include a curved section 32de disposed above the light source 40 and a linear section 32df disposed between the curved section 32de and the flange part 32c. The linear section 32df may at least not be disposed on an upper portion of the light source 40.

Unlike the structure in which the lens part 32b according to the example embodiment illustrated in FIG. 3 has a curved line overall, the lens part 32d according to the example embodiment has differences in that the lens part 32d has a mixed structure of the curved section 32de and the linear section 32df. In addition, unlike the structure disclosed in FIG. 6, the linear section 32df of the lens part 32d may be smoothly, continuously connected to the curved section 32de.

Referring to FIG. 6, the lens part 32d may include a curved section 32dc disposed above the light source 20 and a linear section 32dd disposed between the curved section 32dc and the flange part 32c The linear section 32dd may not be disposed on an upper portion of the light source 40.

Unlike the structure according to the example embodiment illustrated in FIG. 5 in which the linear section 32df of the lens part 32d is smoothly, continuously connected to the curved section 32de, the lens part 32d according to the example embodiment has differences in that the lens part 32d has a structure in which the linear section 32dd thereof is connected to the curved section 32dc while being bent therefrom as shown in FIG. 6.

In addition, the flange part 32c may have a portion linearly extending toward the lens part 32 from the edge thereof connected to the third surface 33 and a curved portion. That is, unlike the structure in which the flange part 32a according to the example embodiment illustrated in FIG. 4 has a concavely curved line, the flange part 32c according to the example embodiment has differences in that the flange part 32c has a mixed structure of a straight line and a curved line.

The lens part 32d may be continuously varied between the linear section 32df of FIG. 5 and the linear section 32dd of FIG. 6.

Figure 7:
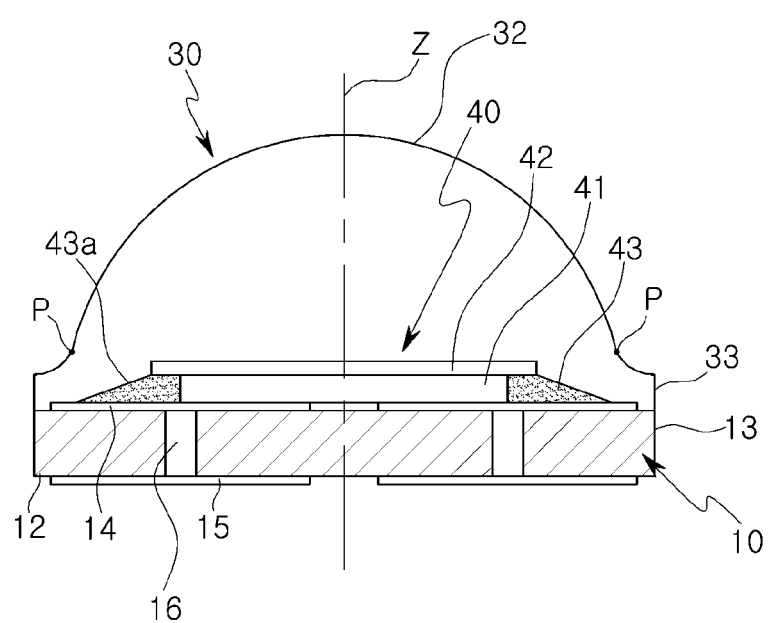
FIG. 7 and FIG. 8 are cross-sectional views each illustrating a light emitting device package according to an example embodiment.
Figure 8:
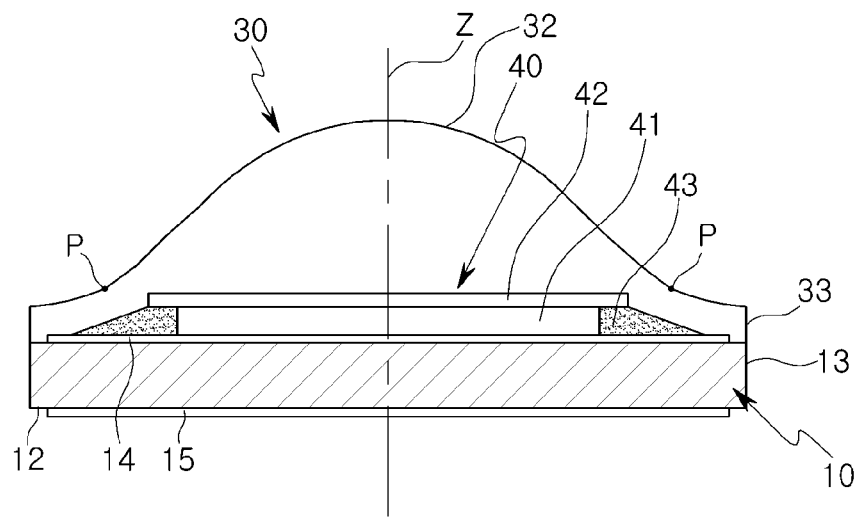

With reference to FIG. 7 and FIG. 8, a light emitting device package 2 according to an example embodiment will be described. FIG. 7 and FIG. 8 are cross-sectional views each illustrating a light emitting device package 2 according to an example embodiment. FIG. 7 schematically illustrates the light emitting device package taken along line I-I' in a horizontal direction, such as in FIG. 3. FIG. 8 schematically illustrates the light emitting device package taken along line II-II' in a diagonal direction, such as in FIG. 4.

Configurations of the light emitting device packages 2 shown in FIG. 7 and FIG. 8 are substantially identical to the example embodiments illustrated in the example embodiments of FIG. 1 through FIG. 6, in terms of the basic structures thereof. However, because the light emitting device package 2 shown in FIG. 7 and FIG. 8 may be different from those illustrated in the example embodiments of FIG. 1 through FIG. 6 in terms of the structure of a light source, hereinafter, a description of portions which overlap those of the foregoing embodiments will be omitted, and the structure of a light source will mainly be explained.

A light source 40 may include a light emitting device 41 and a wavelength conversion layer 42 disposed on the light emitting device 41 and may further include a reflective part 43 covering perimeters of side surfaces of the light emitting device 41. That is, the light source 40 according to the example embodiment may be understood as being substantially identical to that of the foregoing example embodiments, with the exception that the light emitting device 41 further includes the reflective part 43 as a component thereof.

The reflective part 43 may cover the perimeters of the side surfaces of the light emitting device 41 on the substrate 10 to reflect light laterally emitted by the light emitting device 41 in an upward direction. Thus, light of the light emitting device 41 may pass through the wavelength conversion layer 42 and may be incident into the optical device 30.

The reflective part 43 may be formed of a white molding compound having a high degree of light reflectance, whereby effects of increasing the quantity of outwardly emitted light by reflecting light emitted by the light emitting device 41 may be provided. Such a white molding compound may contain a thermosetting resin having high heat resistance or a silicon resin. Alternatively, a thermoplastic resin having a white pigment and filler, a curing agent, a release agent, an antioxidant, an adhesion improver, or the like. In addition, the white molding compound may be formed of FR-4, CEM-3, an epoxy material, a ceramic material or the like.

The reflective part 43 may have at least a height corresponding to a height of the light emitting device 41 in a state of being mounted on the substrate 10. The reflective part 43 may contact the wavelength conversion layer 42 but may not protrude upwardly from an upper surface of the wavelength conversion layer 42.

The reflective part 43 may have a side surface 43a inclined toward the substrate 10 from the wavelength conversion layer 42. The side surface 43a may have a linear cross-sectional shape or a curved cross-sectional shape.

Meanwhile, the reflective part 43 is not an essential component constituting the light source 40 according to the example embodiment and accordingly, may be omitted depending on example embodiments.

Hereinafter, various examples of light emitting devices forming the light sources according to embodiments of the present inventive concept will be described. FIG. 9 through FIG. 12 are cross-sectional views illustrating various examples of an LED chip usable as a light source.

Figure 9:
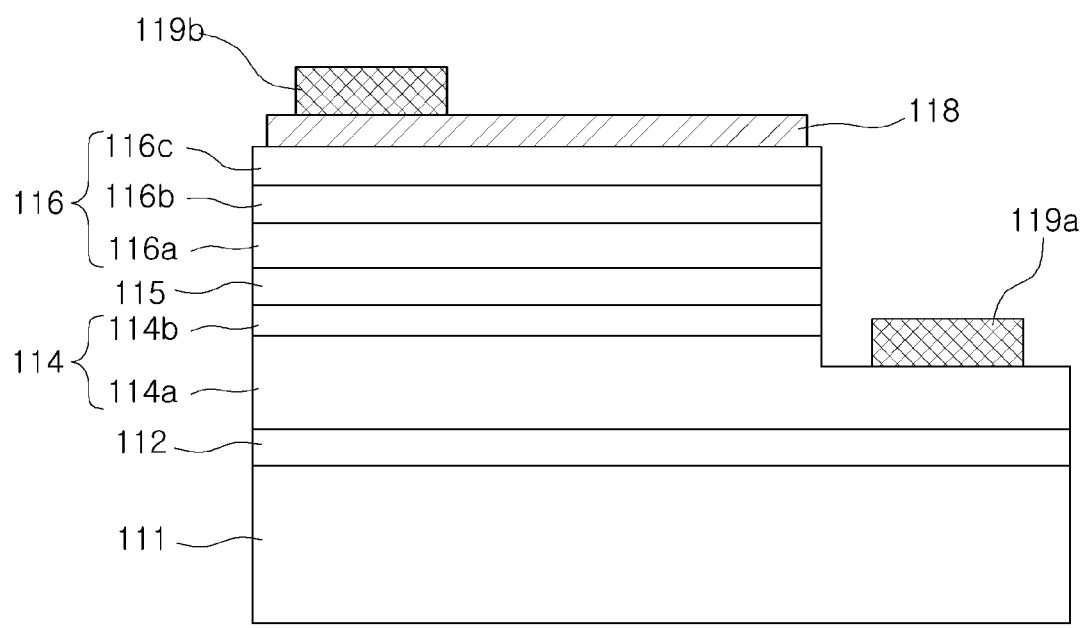
FIG. 9 through FIG. 12 are cross-sectional views illustrating various examples of an LED chip usable as a light source.

Referring to FIG. 9, an LED chip 100 may include a growth substrate 111 and a first conductivity-type semiconductor layer 114, an active layer 115, and a second conductivity-type semiconductor layer 116 sequentially disposed on the growth substrate 111. A buffer layer 112 may be disposed between the growth substrate 111 and the first conductivity-type semiconductor layer 114.

The growth substrate 111 may be an insulating substrate such as sapphire. However, the growth substrate 111 is not limited thereto and alternatively, may be a conductive substrate or semiconductor substrate, in addition to the insulating substrate. For example, the growth substrate 111 may be formed of SiC, Si, $MgAl_2O_4$, MgO, $LiAlO_2$, $LiGaO_2$, or GaN, in addition to sapphire.

The buffer layer 112 may be $In_xAl_yGa_{1-x-y}N$ ($0 \leq x \leq 1$, $0 \leq y \leq 1$, $0 \leq x+y \leq 1$). For example, the buffer layer 112 may be GaN, AlN, AlGaN, or InGaN. If necessary, a combination of a plurality of layers or layers formed by gradually changing a composition may also be used for the material of the buffer layer 112.

The first conductivity-type semiconductor layer 114 may be a nitride semiconductor satisfying n-type $In_xAl_yGa_{1-x-y}N$ ($0 \leq x < 1$, $0 \leq y < 1$, $0 \leq x+y < 1$), and an n-type dopant may be silicon (Si). For example, the first conductivity-type semiconductor layer 114 may include n-type GaN.

In the example embodiment, the first conductivity-type semiconductor layer 114 may include a first conductivity-type semiconductor contact layer 114a and a current spreading layer 114b. A dopant concentration of the first conductivity-type semiconductor contact layer 114a may range from $2\times10^{18}$ cm$^{-3}$ to $9\times10^{19}$ cm$^{-3}$. A thickness of the first conductivity-type semiconductor contact layer 114a may be about 1 μm to 5 μm. The current spreading layer 114b may have a structure in which a plurality of In$_x$Al$_y$Ga$_{(1-x-y)}$N (0≤x, y≤1, 0≤x+y≤1) layers having different compositions or different dopant contents are repeatedly stacked. For example, the current spreading layer 114b may be an n-type superlattice layer in which n-type GaN layers having a thickness of about 1 nm to 500 nm and/or two or more layers having different compositions of Al$_x$In$_y$Ga$_z$N (0≤x,y,z≤1, except for x=y=z=0) are repeatedly stacked. A dopant concentration of the current spreading layer 114b may be about $2\times10^{18}$ cm$^{-3}$ to $9\times10^{19}$ cm$^{-3}$. If necessary, an insulating material layer may be additionally introduced to the current spreading layer 114b.

The second conductivity-type semiconductor layer 116 may be a nitride semiconductor layer satisfying p-type In$_x$Al$_y$Ga$_{1-x-y}$N (0≤x<1, 0≤y<1, 0≤x+y<1), and a p-type dopant may be magnesium (Mg). For example, the second conductivity-type semiconductor layer 116 may be implemented as a single layer structure, but as in the example, may have a multilayer structure having different compositions. As illustrated in FIG. 9, the second conductivity-type semiconductor layer 116 may include an electron blocking layer (EBL) 116a, a low concentration p-type GaN layer 116b, and a high concentration p-type GaN layer 116c provided as a contact layer. For example, the electron blocking layer 116a may have a structure in which a plurality of In$_x$Al$_y$Ga$_{(1-x-y)}$N (0≤x≤1, 0≤y≤1, 0≤x+y≤1) layers having different compositions and ranging from about 5 nm to 100 nm are stacked or may have a single layer configured of Al$_y$Ga$_{(1-y)}$N (0<y≤1). An energy band gap (Eg) of the electron blocking layer 116a may be reduced in a direction away from the active layer 115. For example, Al composition of the electron blocking layer 116a may be reduced in a direction away from the active layer 115.

The active layer 115 may have a multiple quantum well (MQW) structure in which quantum well layers and quantum barrier layers are alternately stacked. For example, the quantum well and quantum barrier layers may be different compositions of In$_x$Al$_y$Ga$_{1-x-y}$N (0≤x≤1, 0≤y≤1, 0≤x+y≤1). In a certain embodiment, the quantum well layer may be In$_x$Ga$_{1-x}$N (0<x≤1) and the quantum barrier layer may be GaN or AlGaN. A thickness of each of the quantum well and quantum barrier layers may range from about 1 nm to 50 nm. The structure of the active layer 115 is not limited to the multiple quantum well (MQW) structure and may also be a single quantum well (SQW) structure.

The LED chip 100 may include a first electrode 119a disposed on the first conductivity-type semiconductor layer 114, and an ohmic-contact layer 118 and a second electrode 119b sequentially stacked on the second conductivity-type semiconductor layer 116.

The first electrode 119a is not limited to, but may contain a material such as Ag, Ni, Al, Cr, Rh, Pd, Jr, Ru, Mg, Zn, Pt, Au or the like. The first electrode 119a may have a structure of a single layer or two or more layers. The LED chip 100 may further include a pad electrode layer on the first electrode 119a. The pad electrode layer may be a layer containing at least one of materials such as Au, Ni, Sn and the like.

The ohmic-contact layer 118 may be variously implemented according to a chip structure. For example, in the case of a flip chip structure, the ohmic-contact layer 118 may contain a metal such as Ag, Au, Al or the like, or a transparent conductive oxide such as ITO, ZIO, GIO or the like. In the case of a structure disposed in a reversed manner, the ohmic-contact layer 118 may be formed of a light transmissive electrode. The light transmissive electrode may be one of a transparent conductive oxide or a transparent conductive nitride. The light transmissive electrode may be at least one selected from indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), In$_4$Sn$_3$O$_{12}$, and Zn$_{(1-x)}$Mg$_x$O(Zinc Magnesium Oxide, 0≤x≤1). If necessary, the ohmic-contact layer 118 may contain graphene. The second electrode 119b may contain at least one of Al, Au, Cr, Ni, Ti, and Sn.

Figure 10A:
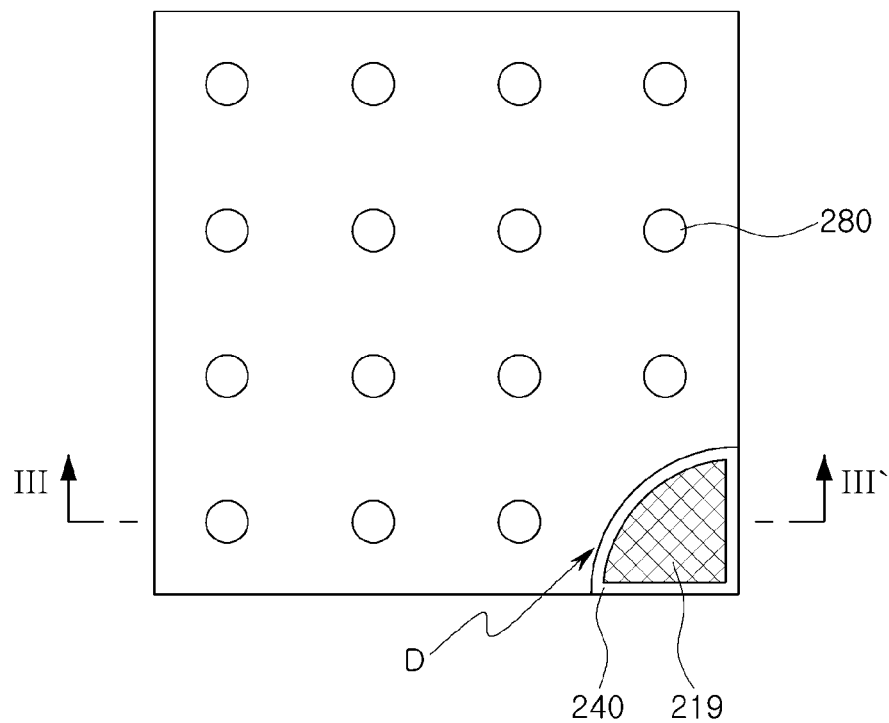
Figure 10B:
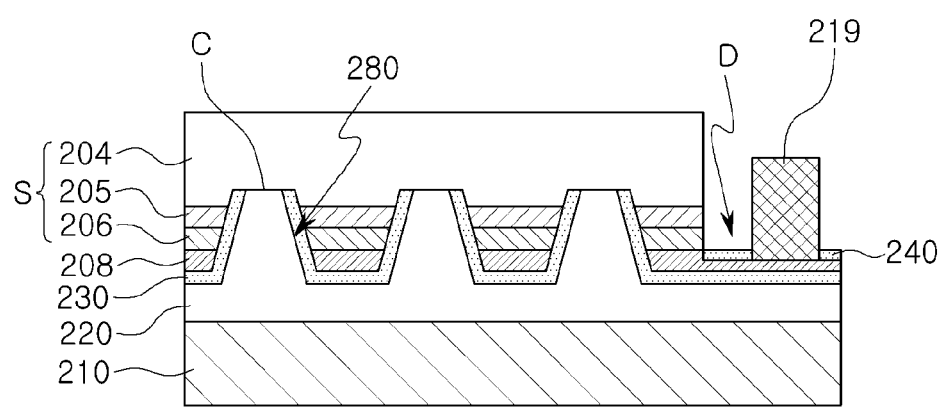

FIG. 10A is a plan view illustrating an example of an LED chip employable in an example embodiment, and FIG. 10B is a side cross-sectional view of the LED chip illustrated in FIG. 10A, taken along line III-III'

An LED chip 200 illustrated in FIG. 10A and FIG. 10B may have a large area structure for a high lighting output. The LED chip 200 may be structured to increase current dispersion efficiency and heat radiation efficiency.

The LED chip 200 may include a light emitting laminate S, a first electrode 220, an insulating layer 230, a second electrode 208, and a conductive substrate 210. The light emitting laminate S may include a first conductivity-type semiconductor layer 204, an active layer 205, and a second conductivity-type semiconductor layer 206 sequentially stacked on one another.

The first electrode 220 may include one or more conductive vias 280 electrically insulated from the second conductivity-type semiconductor layer 206 and the active layer 205 and extended to at least a portion of the first conductivity-type semiconductor layer 204 in order to be electrically connected to the first conductivity-type semiconductor layer 204. The conductive vias 280 may pass through the second electrode 208, the second conductivity-type semiconductor layer 206, and the active layer 205 from an interface of the first electrode 220 and may be extended to the interior of the first conductivity-type semiconductor layer 204. The conductive vias 280 may be formed using an etching process, for example, an inductively coupled plasma-reactive ion etching (ICP-RIE) or the like.

An insulating layer 230 may be provided on the first electrode 220 to electrically insulate the first electrode 220 from other regions except for the first conductivity-type semiconductor layer 204. As illustrated in FIG. 10B, the insulating layer 230 may also be formed on a side surface of the conductive via 280, as well as between the second electrode 208 and the first electrode 220. By doing so, the second electrode 208, the second conductivity-type semiconductor layer 206, and the active layer 205 exposed to the side surface of the conductive via 280 may be insulated from the first electrode 220. The insulating layer 230 may be formed by the deposition of an insulating material such as SiO$_2$, SiO$_x$N$_y$, or Si$_x$N$_y$.

A contact region C of the first conductivity-type semiconductor layer 204 may be exposed by the conductive via 280, and a portion of the first electrode 220 may be formed to contact the contact region C through the conductive via 280. By doing so, the first electrode 220 may be connected to the first conductivity-type semiconductor layer 204.

The number, shape, or pitch of the conductive vias 280 or a contact diameter (or a contact area) thereof with respect to the first and second conductivity-type semiconductor layers 204 and 206 may be appropriately adjusted so as to reduce contact resistance (refer to FIG. 10A). Further, the conductive vias 280 may be variously arranged in rows and columns, whereby current flow may be improved. The number of the conductive vias 280 or the contact area thereof may be adjusted in such a manner that an area of a contact region C may range from about 0.1% to 20%, for example, 0.5% to 15%, and further, 1% to 10%, of a planar area of the light emitting laminate S. In the case that the electrode area is less than 0.1%, current dispersion may not be uniform to deteriorate light emission efficiency. Conversely, in the case that the electrode area is greater than 20%, a light emitting area may be relatively reduced, thereby leading to decreases in light emission properties and luminance properties.

A radius of each conductive via 280 in the contact area coming into contact with the first conductivity-type semiconductor layer 204 may be, for example, approximately 1 µm to 50 µm. The number of the conductive vias 280 may be 1 to 48000 per region of the light emitting laminate S, depending on an area of the region of the light emitting laminate S. The number of the conductive vias 280 may be 2 to 45000, particularly, 5 to 40000, and more particularly, 10 to 35000, per region of the light emitting laminate S, but may be varied depending on an area of the region of the light emitting laminate S. Distances between the respective conductive vias 280 may have a matrix structure having rows and columns of 10 µm to 1000 µm, for example, rows and columns of 50 µm to 700 µm, particularly, rows and columns of 100 µm to 500 µm, and more particularly, rows and columns of 150 µm to 400 µm.

In the case that the distances between the respective conductive vias 280 are smaller than 10 µm, the number of the conductive vias 280 may be increased while a light emitting area may be relatively reduced, thereby leading to a decrease in light emission efficiency. In the case that the distances between the respective conductive vias 280 are greater than 1000 µm, current dispersion may not be facilitated to deteriorate light emission efficiency. Depths of the conductive vias 280 may be differently formed depending on thicknesses of the second conductivity-type semiconductor layer 206 and the active layer 205 and for example, may range from 0.1 µm to 5.0 µm.

As illustrated in FIG. 10B, the second electrode 208 may provide an electrode forming region D extended and exposed outwardly from the light emitting laminate S. The electrode forming region D may include an electrode pad portion 219 for connecting an external power source to the second electrode 208. Although the embodiment illustrates a case in which a single electrode forming region D is provided, the electrode forming region D may be provided in plural, if necessary. As illustrated in FIG. 10A, the electrode forming region D may be formed on one edge of the LED chip 200.

As in the example embodiment, an insulating layer 240 for stopping etching may be disposed in the perimeter of the electrode pad portion 219. The insulating layer 240 for stopping etching may be formed in a surrounding portion of the electrode forming region D prior to the forming of the second electrode 208 after the light emitting laminate S has been formed, and may serve as an etching stopping layer during an etching process for the electrode forming region D.

The second electrode 208 may be formed of a material having a high degree of reflectivity while forming an ohmic-contact with the second conductivity-type semiconductor layer 206. The material of the second electrode 208 may be a reflective electrode material, previously exemplified.

Figure 11:
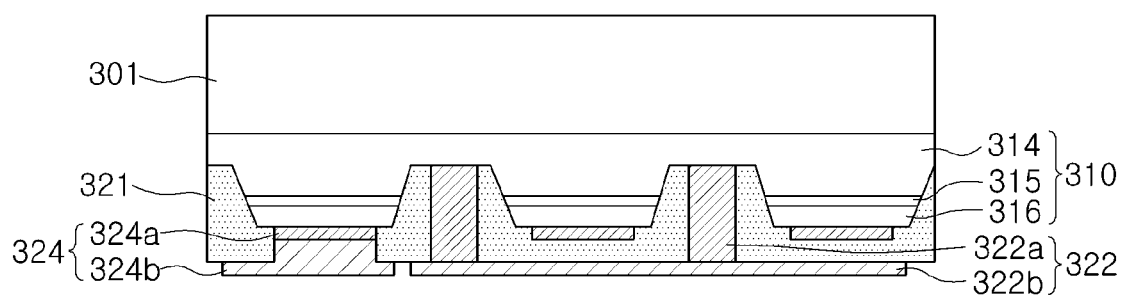

FIG. 11 is a side cross-sectional view illustrating one example of an LED chip employable in an example embodiment.

Referring to FIG. 11, an LED chip 300 may include a semiconductor laminate 310 formed on a substrate 301. The semiconductor laminate 310 may include a first conductivity-type semiconductor layer 314, an active layer 315, and a second conductivity-type semiconductor layer 316.

The LED chip 300 may include first and second electrodes 322 and 324 connected to the first and second conductivity-type semiconductor layers 314 and 316, respectively. The first electrode 322 may include a connection electrode portion 322a such as a conductive via, which penetrates through the second conductivity-type semiconductor layer 316 and the active layer 315 to be connected to the first conductivity-type semiconductor layer 314, and a first electrode pad 322b connected to the connection electrode portion 322a. The connection electrode portion 322a may be surrounded by an insulating portion 321 and may be electrically separated from the active layer 315 and the second conductivity-type semiconductor layer 316. The connection electrode portion 322a may be disposed in an etched region of the semiconductor laminate 310. The number, shape, or pitch of the connection electrode portion 322a or a contact area thereof with respect to the first conductivity-type semiconductor layer 314 may be appropriately designed so as to reduce contact resistance. Further, the connection electrode portion 322a may be arranged in rows and columns on the semiconductor laminate 310, whereby a current flow may be improved. The second electrode 324 may include an ohmic-contact layer 324a and a second electrode pad 324b on the second conductivity-type semiconductor layer 316.

Each of the connection electrode portion and the ohmic-contact layer 322a and 324a may include a single layer or multilayer structure of a conductive material having ohmic-characteristics with the first and second conductivity-type semiconductor layers 314 and 316. For example, the connection electrode portion and the ohmic-contact layer 322a and 324a may be formed by a process such as depositing or sputtering one or more of Ag, Al, Ni, Cr, a transparent conductive oxide (TCO) and the like.

The first and second electrode pads 322b and 324b may be connected to the connection electrode portion and the ohmic-contact layer 322a and 324a to serve as external terminals of the LED chip 300. For example, the first and second electrode pads 322b and 324b may be formed of Au, Ag, Al, Ti, W, Cu, Sn, Ni, Pt, Cr, NiSn, TiW, AuSn or eutectic metals thereof.

The first and second electrodes 322 and 324 may be disposed in the same direction and may be mounted on the lead frame or the like, in a flip-chip scheme.

Meanwhile, the two electrodes 322 and 324 may be electrically separated from each other by the insulating portion 321. The insulating portion 321 may be formed of any material, as long as the material has electrical insulating properties. Any material having electrical insulating properties while a low degree of light absorptivity may be employed. For example, the insulating portion 321 may be formed of a silicon oxide or a silicon nitride such as $SiO_2$, $SiO_xN_y$, $Si_xN_y$, or the like. If necessary, a light reflecting structure may be formed by dispersing light reflective fillers in a light transmissive material. Unlike this, the insulating portion 321 may have a multilayer reflection structure in which a plurality of insulating layers having different refractive indices may be alternately stacked. For example, such a multilayer reflection structure may be a distributed Bragg reflector (DBR) in which a first insulating layer having a first refractive index and a second insulating layer having a second refractive index are alternately stacked.

The multilayer reflection structure may be formed by repeatedly stacking a plurality of insulating layers having different reflective indices 2 times to 100 times, for example, 3 times to 70 times, and further, 4 times to 50 times. The plurality of insulating layers of the multilayer reflection structure may be formed of an oxide or nitride and combinations thereof, such as $SiO_2$, SiN, $SiO_xN_y$, $TiO_2$, $Si_3N_4$, $Al_2O_3$, TiN, AN, $ZrO_2$, TiAlN, TiSiN or the like. For example, when a wavelength of light generated in the active layer is λ, and a refractive index of the corresponding layer is n, the first insulating layer and the second insulating layer may be formed to have a thickness of λ/4n, approximately 300 Å to 900 Å. In this case, the refractive indices and thicknesses of the first insulating layer and the second insulating layer may be selectively designed in such a manner that the insulating layers have a high degree of reflectance (95% or more) with respect to the wavelength of light generated in the active layer 315.

The refractive indices of the first insulating layer and the second insulating layer may be determined within a range of about 1.4 to about 2.5 and may be lower than refractive indices of the first conductivity-type semiconductor layer 314 and the substrate, but may also be higher than the refractive index of the substrate while being lower than the refractive index of the first conductivity-type semiconductor layer 314.

Figure 12:
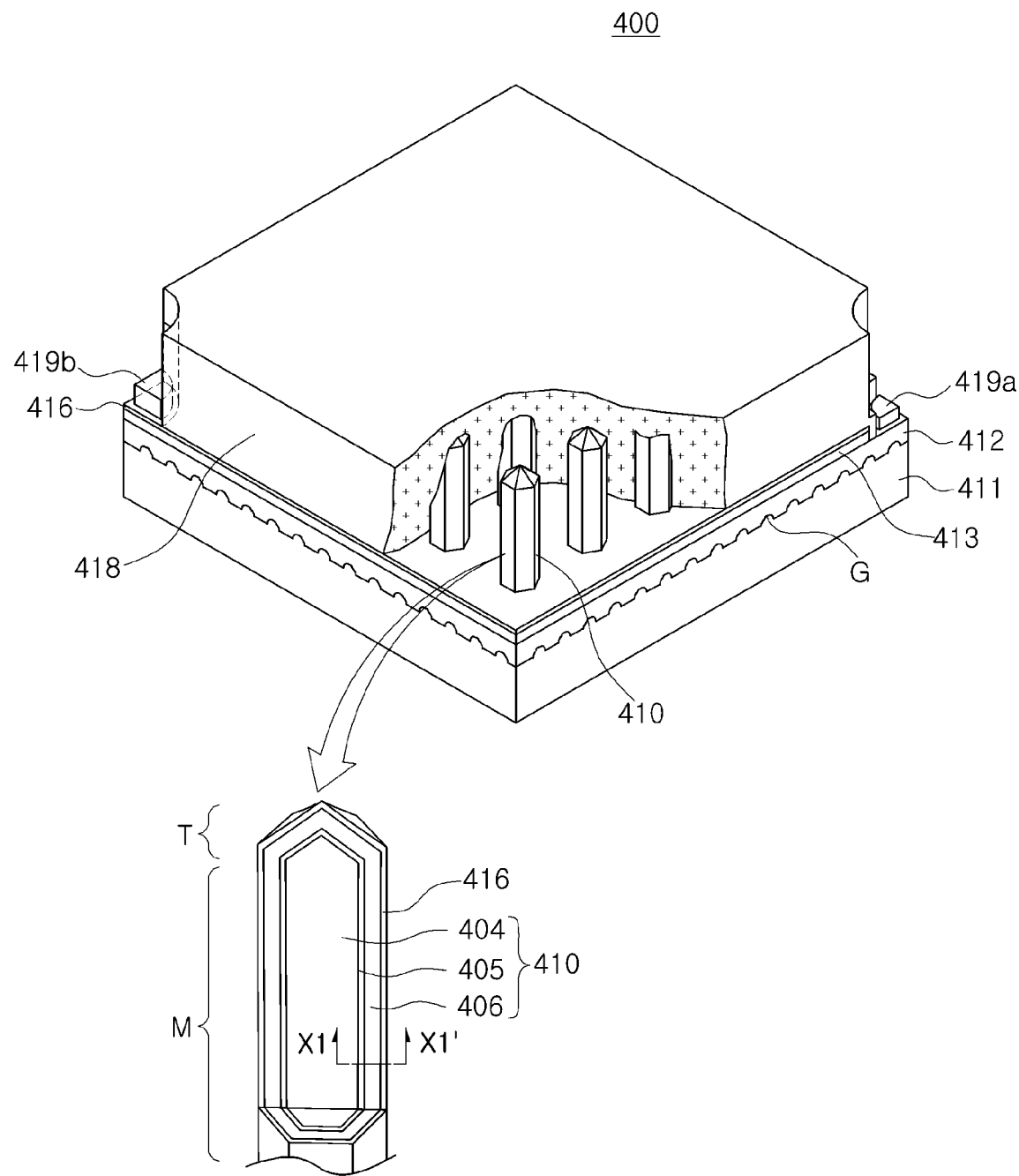

FIG. 12 is a cross-perspective view illustrating another example of an LED chip employable in an example embodiment.

Referring to FIG. 12, an LED chip 400 may include a base layer 412 formed of a first conductivity-type semiconductor material and a plurality of light emitting nanostructures 410 disposed thereon.

The LED chip 400 may include a substrate 411 having an upper surface on which the base layer 412 is disposed. An unevenness structure G may be formed on the upper surface of the substrate 411. The unevenness structure G may improve light extraction efficiency and may enhance quality of a grown single-crystal. The substrate 411 may be an insulating substrate, a conductive substrate or a semiconductor substrate. For example, the substrate 411 may be sapphire, SiC, Si, $MgAl_2O_4$, MgO, $LiAlO_2$, $LiGaO_2$, or GaN.

The base layer 412 may include a first conductivity-type nitride semiconductor layer and may provide a growth surface for growth of the light emitting nanostructures 410. The base layer 412 may be a nitride semiconductor satisfying $In_xAl_yGa_{1-x-y}N$ (0≤x≤1, 0≤y<1, 0≤x+y<1) and may be doped with an n-type dopant such as Si. For example, the base layer 412 may be n-type GaN.

An insulating layer 413 having openings for growth of the light emitting nanostructures 410 (in particular, nanocores 404) may be formed on the base layer 412. The nanocores 404 may be formed on regions of the base layer 412 exposed by the openings. The insulating layer 413 may be used as a mask for growth of the nanocores 404. For example, the insulating layer 413 may be formed of an insulating material such as $SiO_2$ or $SiN_x$.

Each of the light emitting nanostructures 410 may include a main portion M having a hexagonal prismatic structure and an upper end portion T positioned on the main portion M. Side surfaces of the main portion M of the light emitting nanostructure 410 may have the same crystal planes, and the upper end portion T of the light emitting nanostructure 410 may have crystal planes different from those of the side surfaces thereof. The upper end portion T of the light emitting nanostructure 410 may have a hexagonal pyramid shape. The division of such a structure may actually be determined by the nanocore 404, and the nanocore 404 may be understood as being divided into a main portion M and an upper end portion T.

Each of the light emitting nanostructures 410 may have the nanocore 404 formed of a first conductivity-type nitride semiconductor, an active layer 405 and a second conductivity-type nitride semiconductor layer 406 sequentially disposed on a surface of the nanocore 404.

The LED chip 400 may include a contact electrode 416 connected to the second conductivity-type nitride semiconductor layer 406. The contact electrode 416 employed in the embodiment may be formed of a conductive material having light transmissive properties. The contact electrode 416 may ensure emission of light toward the light emitting nanostructures (in a direction opposite to the substrate). Although not limited thereto, the contact electrode 416 may be one of a transparent conductive oxide layer or transparent conductive nitride layer. For example, the contact electrode 416 may be at least one selected from indium tin oxide (no), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$ and $Zn_{(1-x)}Mg_xO$ (Zinc Magnesium Oxide, 0≤x≤1). If necessary, the contact electrode 416 may contain graphene.

A material of the contact electrode 416 is not limited to a light transmissive material and if necessary, may have a reflective electrode structure. For example, the contact electrode 416 may contain a material such as Ag, Ni, Al, Rh, Pd, Jr, Ru, Mg, Zn, Pt, Au or the like, and may have a structure of two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt and the like. The contact electrode 416 may employ such a reflective electrode structure and may be implemented in a flip-chip structure.

An insulating protective layer 418 may be formed on the light emitting nanostructures 410. The insulating protective layer 418 may be a passivation layer for protecting the light emitting nanostructures 410. In addition, the insulating protective layer 418 may be formed of a material having light transmissive properties so as to extract light generated in the light emitting nanostructures 410. In this case, as a material of the insulating protective layer 418, a material having an appropriate refractive index may be selected to thereby improve light extraction efficiency.

As in the embodiment, after forming the contact electrode 416, a space between the plurality of light emitting nanostructures 410 may be filled with the insulating protective layer 418. The insulating protective layer 418 may be formed of an insulating material such as $SiO_2$ or $SiN_x$. For example, the insulating protective layer 418 may be formed of a material such as TEOS (TetraEthylOrthoSilane), BPSG (BoroPhospho Silicate Glass), CVD-$SiO_2$, SOG (Spin-on Glass), or SOD (Spin-on Dielectric).

However, the inventive concept is not limited to a case in which the insulating protective layer 418 fills the space between the light emitting nanostructures 410. For example, in another form, the space between the light emitting nanostructures 410 may be filled with an electrode component (for example, a reflective electrode material) such as the contact electrode 416.

The LED chip 400 may include first and second electrodes 419a and 419b. The first electrode 419a may be disposed on an exposed portion of the base layer 412 formed of the first conductivity-type semiconductor. In addition, the second electrode 419b may be disposed on an exposed extension portion of the contact electrode 416. The arrangements of the electrodes are not limited thereto and depending on a user's environments, a variety of different electrode arrangements may be provided.

In the case of the LED chip 400 having a core/shell-type nanostructure, a bond density thereof is low, and accordingly, a relatively smaller amount of heat may be generated, a light emission area may be increased by using a nanostructure to increase light emission efficiency, and a nonpolar active layer may be obtained to prevent a deterioration in efficiency due to polarization, whereby droop characteristics may be improved.

In addition, the plurality of light emitting nanostructures 410 may emit light having two or more different wavelengths by varying diameters or intervals (pitches) of a plurality of open regions of the mask layer, or an indium (In) component or a doping concentration introduced in the active layer 405 of each light emitting nanostructure. White light may be implemented in a single device without the use of phosphors by appropriately controlling light having different wavelengths. Another LED chip or a wavelength conversion material such as a phosphor may be combined with such a device, whereby light having desired various colors or white light having a different color temperature may be implemented.

Meanwhile, the wavelength conversion layer 22 covering an upper surface of the light emitting device 21, that is, an LED chip, may have a cross-sectional area corresponding to or greater than that of the upper surface of the LED chip (refer to FIG. 3 and FIG. 4). The wavelength conversion layer 22 may contain a wavelength conversion material.

The wavelength conversion material may contain at least one or more phosphors excited by light generated by the light emitting device 21 and emitting light of different wavelengths. By doing so, a control may be made such that various colors of light as well as white light may be emitted.

For example, in a case in which the Light emitting device 21 emits blue light, white light may be emitted by combining yellow, green, red, and/or orange colored phosphors. In addition, the light emitting device 21 may be configured to include at least one LED chip emitting violet, blue, green, red, or ultraviolet light. In this case, a color rendering index (CRI) of the light emitting device 21 may be adjusted from about 40 to 100, and the light emitting device 21 may generate various types of white light with color temperatures ranging from about 2000K to 20000K. Also, if necessary, the light emitting device 21 may generate visible violet, blue, green, red, orange, or infrared light to adjust the color of light according to a surrounding atmosphere and a desired user mood. Also, the light emitting device 21 may generate a specific wavelength of light for promoting growth of plants.

Figure 13:
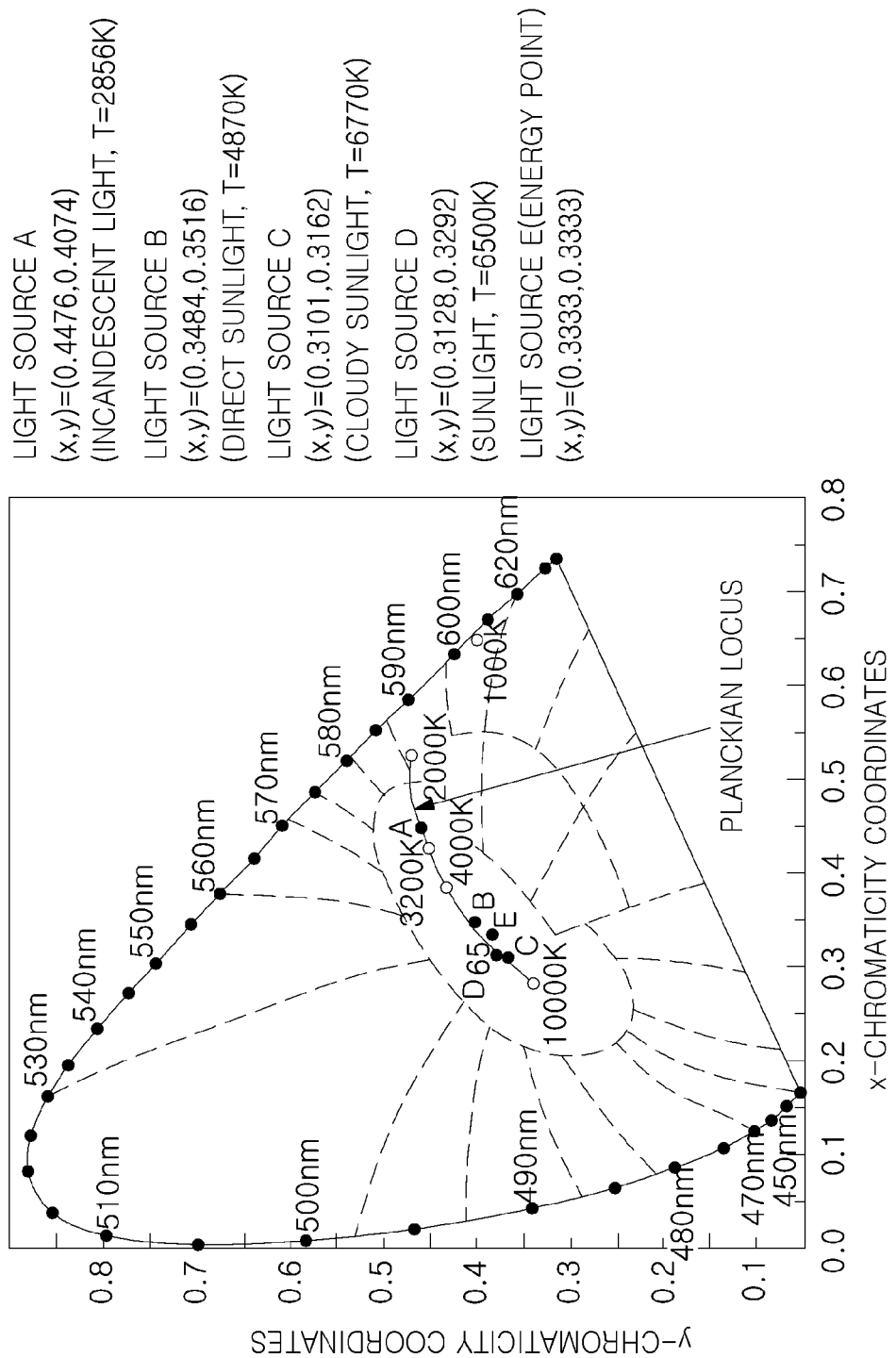
FIG. 13 is the CIE 1931 color space diagram illustrating a wavelength conversion material employable in the example embodiment.

White light formed by combining yellow, green, and red phosphors with a blue LED chip and/or combining green and red LED chips may have two or more peak wavelengths, and coordinates (x, y) thereof in the CIE 1931 Chromaticity Coordinate of FIG. 13 may be positioned on a line segment connecting (0.4476, 0.4074), (0.3484, 0.3516), (0.3101, 0.3162), (0.3128, 0.3292), and (0.3333, 0.3333). Alternatively, coordinates (x, y) thereof in the CIE 1931 Chromaticity Coordinate may be positioned in a region surrounded by the line segment and blackbody radiation spectrum. The color temperature of white light may range from 2000K to 20000K.

In FIG. 13, white light in the vicinity of point E (0.3333, 0.3333), disposed below the blackbody radiation spectrum, may be in a state in which a level of yellow light is relatively low and may be used as a lighting light source in a region exhibiting a more bright or fresh feeling. Therefore, lighting products using white light in the vicinity of point E (0.3333, 0.3333), disposed below the blackbody radiation spectrum, may be highly effective as lighting devices for retail spaces offering groceries, clothes and the like for sale.

The phosphors may have the following compositional formulas and colors.

Oxides: yellow and green $Y_3Al_5O_{12}$:Ce, $Tb_3Al_5O_{12}$:Ce, $Lu_3Al_5O_{12}$:Ce Silicates: yellow and green $(Ba,Sr)_2SiO_4$:Eu, yellow and orange $(Ba,Sr)_3SiO_5$:Ce Nitrides: green β-SiAlON:Eu, yellow $La_3Si_6N_{11}$:Ce, orange α-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \le x \le 3$, $0 < z < 0.3$, $0 < y \le 4$) (where, Ln is at least one element selected from a group consisting of group IIIa elements and rare-earth elements, and M is at least one element selected from a group consisting of Ca, Ba, Sr and Mg)

Fluorides: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$, $K_3SiF_7$:$Mn^{4+}$ Phosphor compositions should basically conform to stoichiometry, and respective elements may be substituted with other elements of respective groups of the periodic table. For example, strontium (Sr) may be substituted with barium (Ba), calcium (Ca), magnesium (Mg), and the like within the alkaline earth group (II), and yttrium (Y) may be substituted with lanthanum (La)-based elements such as terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to a desired energy level, and an activator may be applied alone or with a co-activator for modifying characteristics of phosphors.

In particular, in order to enhance reliability at high temperatures and high humidity, a fluoride-based red phosphor may be coated with a fluoride not containing manganese (Mn) or with organic materials thereon. The organic materials may be coated on the fluoride-based red phosphor coated with a fluoride not containing manganese (Mn). Unlike other phosphors, the fluoride-based red phosphor may realize a narrow full width at half maximum (FWHM) equal to or less than 40 nm, and thus, it may be utilized in high resolution TVs such as UHD TVs.

Further, as a material to be substituted for the phosphor, a quantum dot (QD) or the like may be used in the wavelength conversion material, and the QD may be used alone or in combination with the phosphor.

Figure 14:
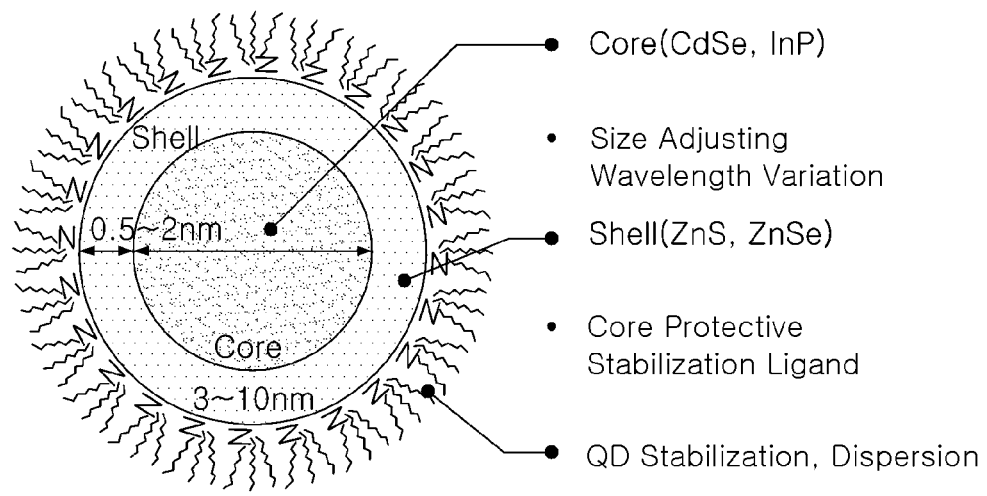
FIG. 14 is a schematic view illustrating a cross-sectional structure of a quantum dot (QD)

FIG. 14 is a view illustrating a cross-sectional structure of a quantum dot. The quantum dot may have a core-shell structure using group II-VI or group III-V compound semiconductors. For example, the quantum dot may have a core such as CdSe or InP or a shell such as ZnS or ZnSe. Also, the quantum dot may include a ligand to stabilize the core and shell. For example, the core may have a diameter ranging from about 1 nm to 30 nm, and particularly, about 3 nm to 10 nm. The shell may have a thickness ranging from about 0.1 nm to 20 nm, and particularly, 0.5 nm to 2 nm.

The quantum dot may realize various colors of light according to a size thereof and, in particular, when the quantum dot is used as a phosphor substitute, it may be substituted for a red or green phosphor. The use of the quantum dot may allow a narrow FWHM (e.g., about 35 nm) to be realized.

With reference to FIG. 15 through FIG. 20, a method of manufacturing a light emitting device package according to an example embodiment will be described.

Figure 15:
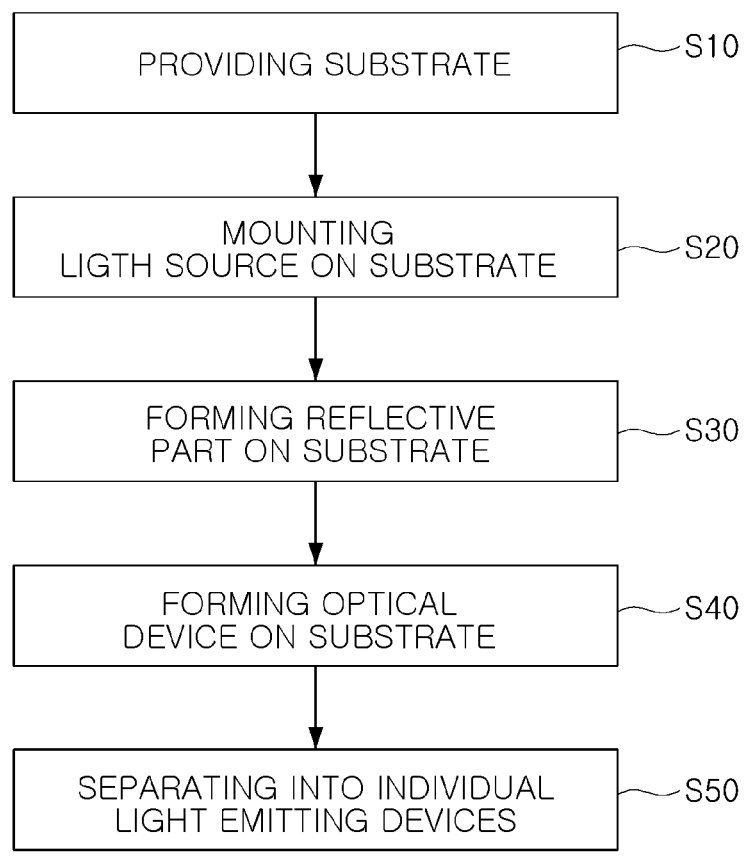
FIG. 15 is a flow chart schematically illustrating a method of manufacturing a light emitting device package according to an example embodiment.

FIG. 15 is a flow chart schematically illustrating a method of manufacturing a light emitting device package according to an example embodiment. FIG. 16A through FIG. 20B are views schematically illustrating respective processes of the method of manufacturing a light emitting device package according to an example embodiment.

Figure 16A:
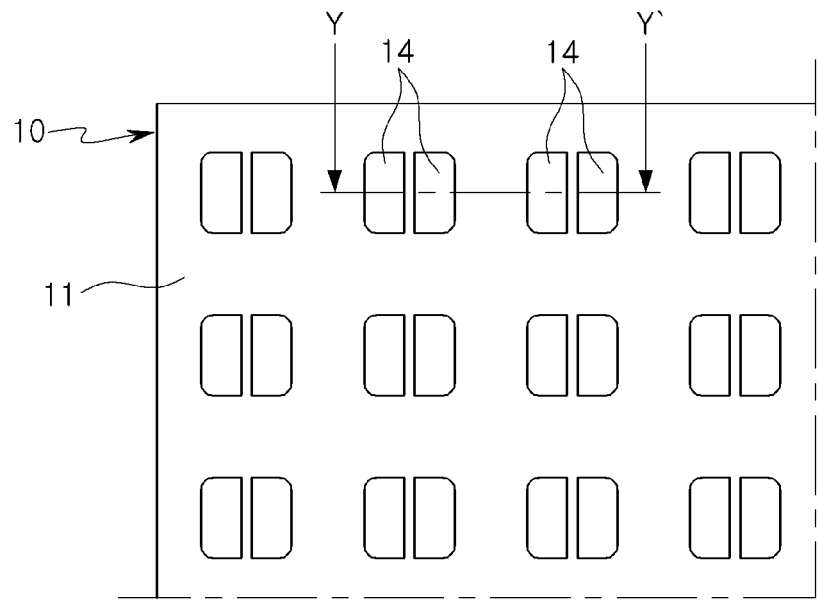
FIG. 16A through FIG. 20B are views schematically illustrating respective processes of the method of manufacturing a light emitting device package according to an example embodiment.
Figure 16B:
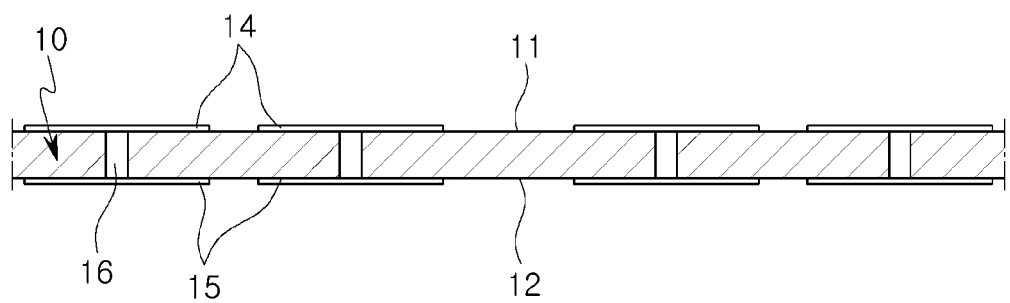
Figure 19A:
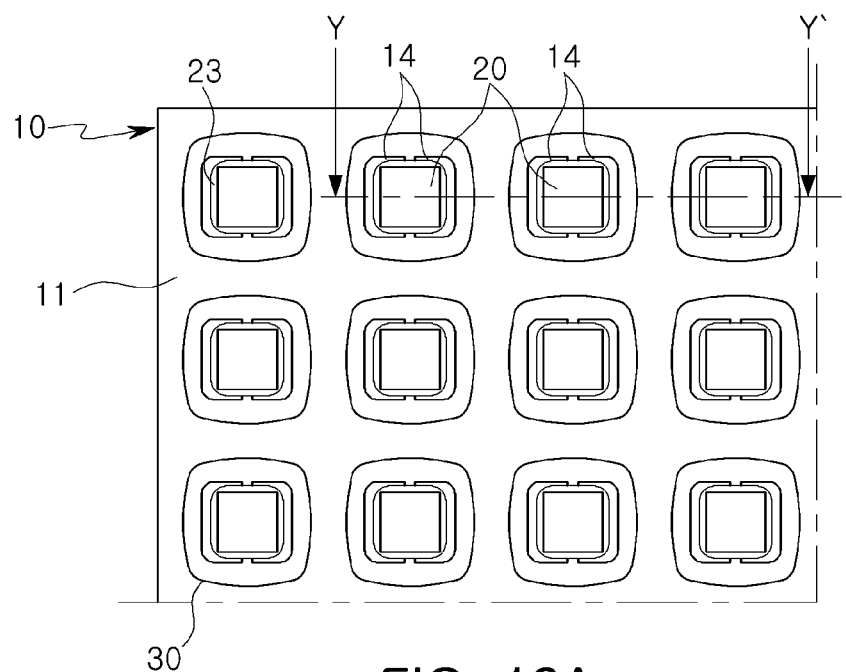
Figure 19B:
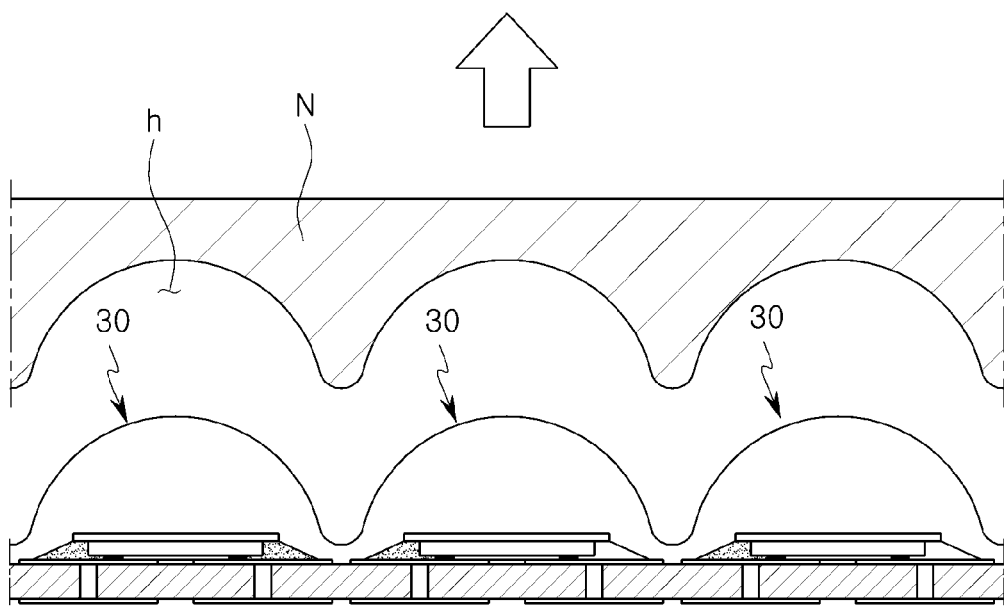
Figure 20A:
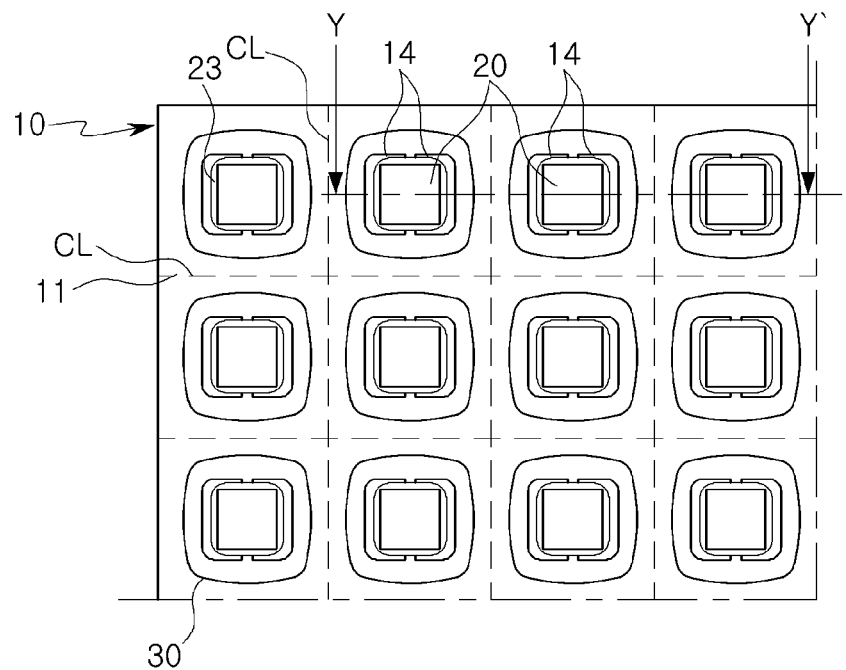
Figure 20B:
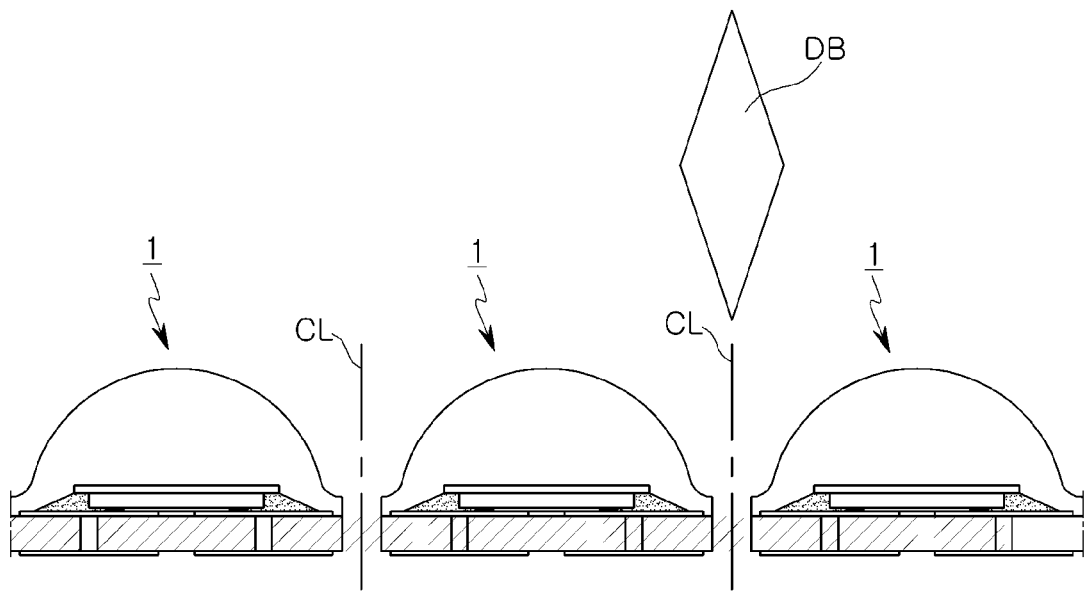

Referring to FIG. 16A and FIG. 20B, FIG. 16A is a plan view of a substrate and FIG. 16B is a cross-sectional view of FIG. 16A, taken along line Y-Y'. FIG. 17A through FIG. 20B are illustrated in the same manner as those described above.

First, FIG. 15 and FIGS. 16A and 16B schematically illustrate a process of providing the substrate 10 having the upper electrodes 14 on the upper surface 11 and the lower electrodes 15 on the lower surface 12, and the through-electrodes 16 connecting the upper electrodes 14 and the lower electrodes 15 to each other (S10).

The upper electrodes 14, the lower electrodes 15, and the through-electrodes 16 may be provided in plural and may be arranged in a matrix form on the substrate 10. The electrodes 14, 15 and 16 may be formed of a conductive material commonly known in the art, for example, one or more of Ag, Al, Ni, Cr, Cu, Au, Pd, Pt, Sn, W, Rh, Jr, Ru, Mg, Zn, Ti or alloy materials containing these components.

Figure 17A:
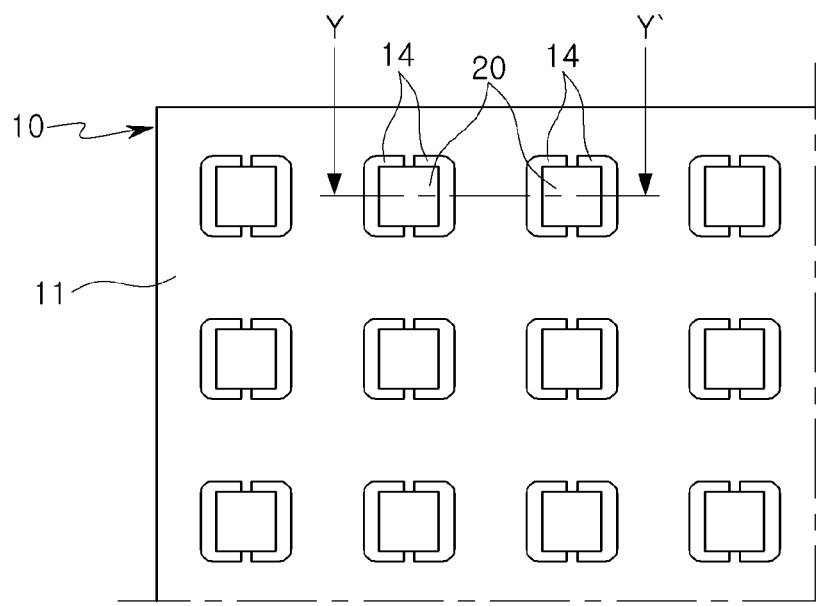
Figure 17B:
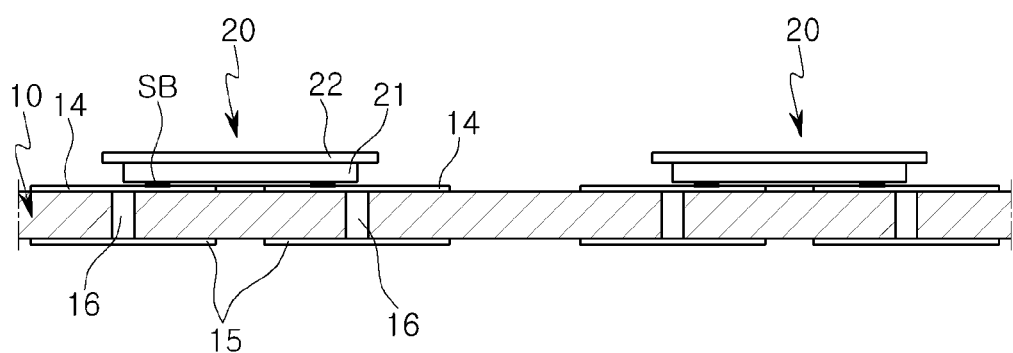

FIG. 15 and FIGS. 17A and 17B schematically illustrate a process of mounting the light source 20 on the upper surface 11 of the substrate 10 (S20).

The light source 20 may include the light emitting device 21 and the wavelength conversion layer 22 disposed on the light emitting device 21.

The light emitting device 21 may be, for example, an LED chip having a flip-chip structure. The light emitting device 21 may be bonded to the upper electrodes 14 by soldering portions SB to be electrically connected thereto. The wavelength conversion layer 22 may be attached to the upper surface of the light emitting device 21.

A plurality of light sources 20 may be mounted on the substrate 10 to be arranged to correspond to positions of the upper electrodes 14.

Figure 18A:
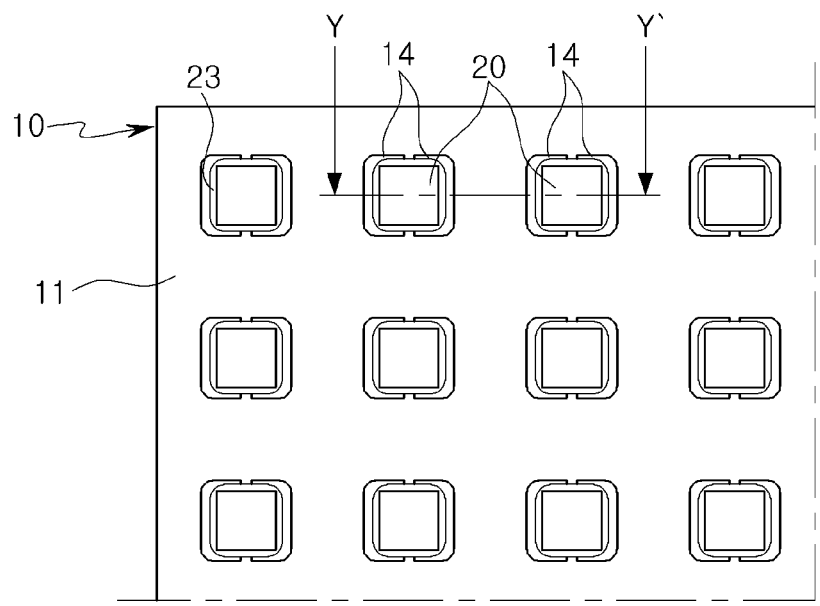
Figure 18B:
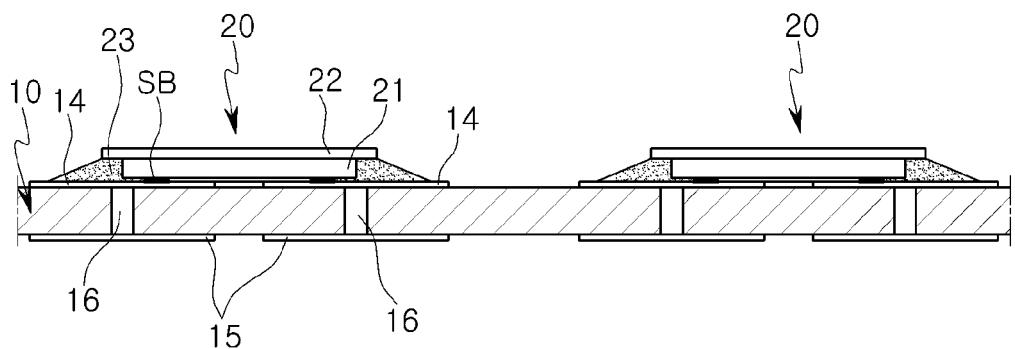

FIG. 15 and FIGS. 18A and 18A schematically illustrate a process of forming a reflective part 23 covering perimeters of side surfaces of the light emitting device 21 on the substrate 10 (S30).

For example, the reflective part 23 may be formed by a scheme of injecting a semi-hardened white molding compound having viscosity into the perimeters of the side surfaces of the light emitting device 21 by an ejector and then, curing the compound.

Meanwhile, the reflective part 23 is not an essential component constituting the light emitting device package according to the example embodiment and accordingly, may be omitted depending on example embodiments.

FIG. 15 and FIGS. 19a and 19b schematically illustrate a process of forming the optical device 30 covering the light source 20 on the substrate 10 (S40).

The optical device 30 may be formed by a scheme of injecting a liquid solvent in a vessel into a mold N to be solidified. For example, the scheme may include an injection molding method, a transfer molding method, a compression molding method and the like.

The mold N may have a space h having a shape corresponding to a shape of the optical device 30. The space h may be provided in plural, and each of the plurality of spaces h may be arranged in a position corresponding to that of each light source 20 arranged on the substrate 10.

The mold N may be disposed above the substrate 10 such that each light source 20 is disposed within each space h, and may be removed after injecting the liquid solvent into the space h and solidifying the solvent.

FIG. 15 and FIGS. 20a and 20b schematically illustrate a process of performing separation into individual light emitting devices 1 (S50).

For example, a dicing may be performed along a cutting line CL between the light source 20 and the light source 20 by a dicing blade DB. The light emitting device package 1 separated as described above may be mounted in, for example, backlight units, lighting devices, and the like.

Figure 21:
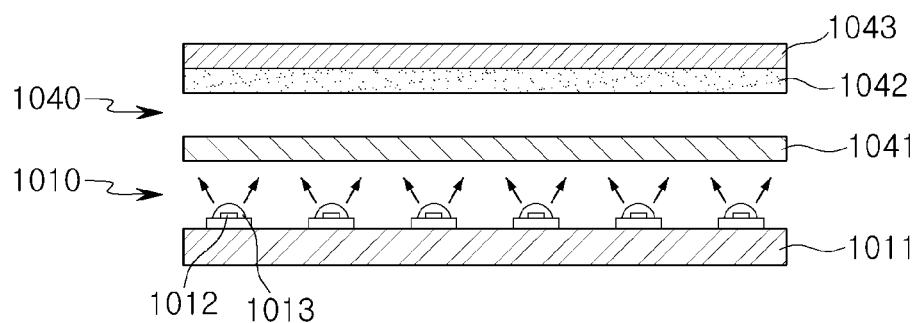
FIG. 21 is a cross-sectional view schematically illustrating a lighting device according to an example embodiment.
Figure 22:
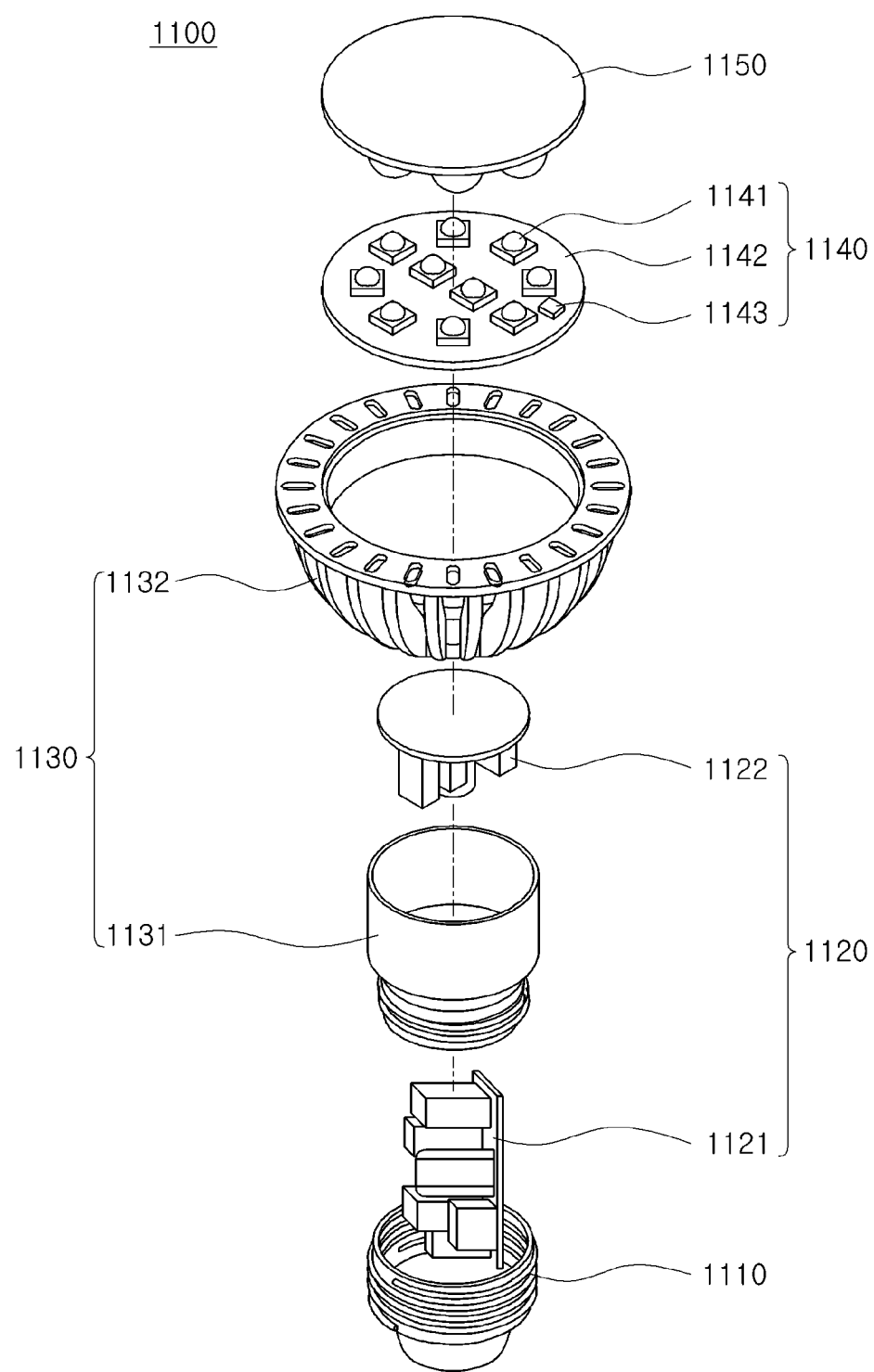
FIG. 22 is an exploded perspective view schematically illustrating a lighting device (bulb type) according to an example embodiment.
Figure 23:
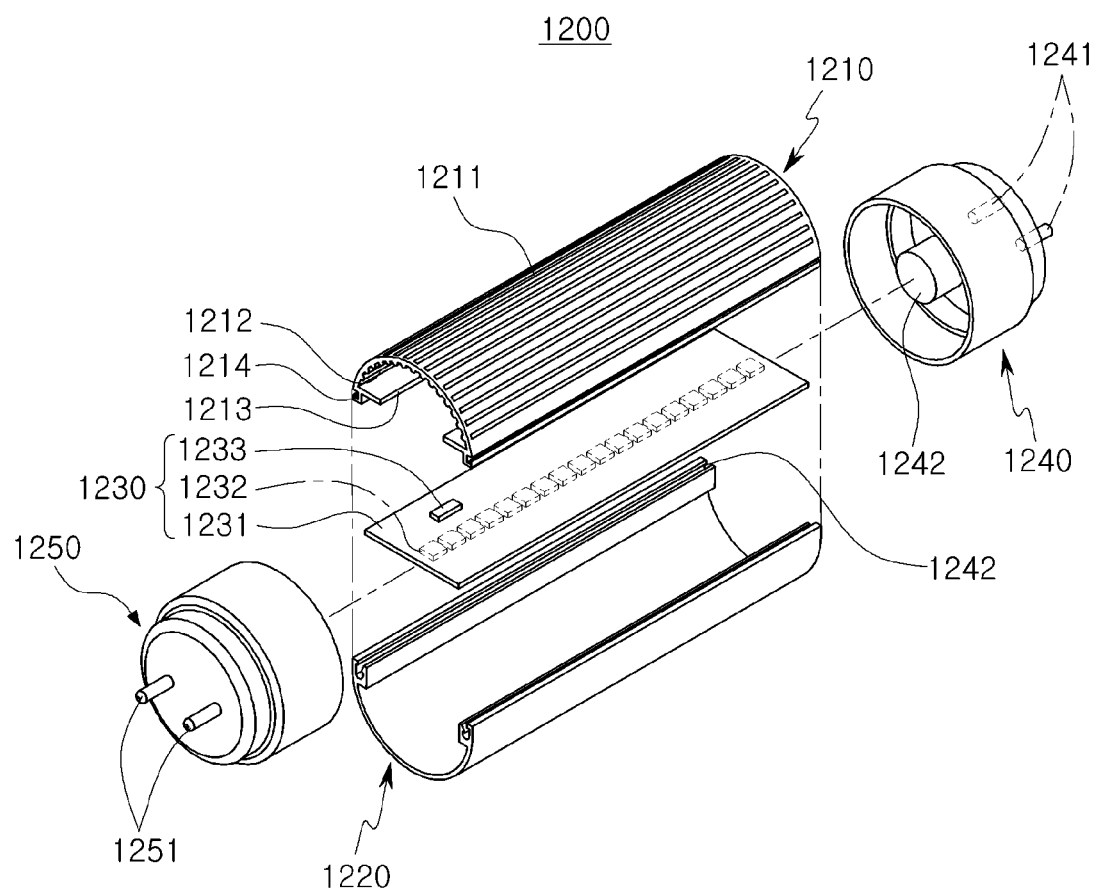
FIG. 23 is an exploded perspective view schematically illustrating a lighting device (L-lamp type) according to an example embodiment.

With reference to FIG. 21 through FIG. 23, various embodiments of a lighting device employing the light emitting device package according to the example embodiment of the inventive concept will be described FIG. 21 schematically illustrates a lighting device according to an example embodiment. Referring to FIG. 21, a lighting device 1000 may have, by way of example, a surface light source type structure, and may be a direct type backlight unit.

The lighting device 1000 according to the example embodiment may include an optical sheet 1040 and a light source module 1010 arranged below the optical sheet 1040.

The optical sheet 1040 may include a diffusion sheet 1041, a light collecting sheet 1042, a protective sheet 1043, and the like.

The light source module 1010 may include a printed circuit board 1011, a plurality of light sources 1012 mounted on an upper surface of the printed circuit board 1011, and a plurality of optical devices 1013 disposed above the plurality of respective light sources 1012. In the embodiment, the light source module 1010 may have a structure similar to the light emitting device package 1 of FIG. 1. A concrete description regarding respective components of the light source module 1010 may be understood with reference to the foregoing embodiment (for example, please refer to FIG. 1).

FIG. 22 is an exploded perspective view schematically illustrating a bulb type lamp as a lighting device according to an example embodiment.

In detail, a lighting device 1100 may include a socket 1110, a power source unit 1120, a heat dissipation unit 1130, a light source module 1140, and an optical unit 1150. According to an example embodiment, the light source module 1140 may include a light emitting device array, and the power source unit 1120 may include a light emitting device driving unit.

The socket 1110 may be configured to be replaced with an existing lighting device. Power supplied to the lighting device 1100 may be applied through the socket 1110. As illustrated, the power source unit 1120 may include a first power source unit 1121 and a second power source unit 1122. The first power source unit 1121 and the second power source unit 1122 may be separately provided and assembled to form the power source unit 1120.

The heat dissipation unit 1130 may include an internal heat dissipation unit 1131 and an external heat dissipation unit 1132. The internal heat dissipation unit 1131 may be directly connected to the light source module 1140 and/or the power source unit 1120 to thereby transmit heat to the external heat dissipation unit 1132.

The optical unit 1150 may include an internal optical unit (not shown) and an external optical unit (not shown) and may be configured to evenly distribute light emitted by the light source module 1140.

The light source module 1140 may emit light to the optical unit 1150 upon receiving power from the power source unit 1120. The light source module 1140 may include one or more light emitting devices 1141, a circuit board 1142, and a controller 1143. The controller 1143 may store driving information of the light emitting devices 1141.

In the embodiment, the light source module 1140 may have a structure similar to the light emitting device package 1 of FIG. 1. A concrete description regarding respective components of the light source module 1140 may be understood with reference to the foregoing embodiment (for example, please refer to FIG. 1).

FIG. 23 is an exploded perspective view schematically illustrating a bar type lamp as a lighting device according to an example embodiment.

In detail, a lighting device 1200 includes a heat dissipation member 1210, a cover 1220, a light source module 1230, a first socket 1240, and a second socket 1250. A plurality of heat dissipation fins 1211 and 1212 may be formed in a concavo-convex pattern on an internal or/and external surface of the heat dissipation member 1210, and the heat dissipation fins 1211 and 1212 may be designed to have various shapes and intervals (spaces) therebetween. A support portion 1213 having a protruded shape may be formed on an inner side of the heat dissipation member 1210. The light source module 1230 may be fixed to the support portion 1213. Stoppage protrusions 1214 may be formed on both ends of the heat dissipation member 1210.

The stoppage recesses 1221 may be formed in the cover 1220, and the stoppage protrusions 1214 of the heat dissipation member 1210 may be coupled to the stoppage recesses 1221. The positions of the stoppage recesses 1221 and the stoppage protrusions 1214 may be interchanged.

The light source module 1230 may include a light emitting device array. The light source module 1230 may include a PCB 1231, a light source 1232 having an optical device, and a controller 1233. As described above, the controller 1233 may store driving information of the light source 1232. Circuit wirings are formed on the PCB 1231 to operate the light source 1232. Also, components for operating the light source 1232 may be provided. In the embodiment, the light source module 1230 is substantially identical to the light emitting device package 1 of FIG. 1 and a detailed description thereof will be omitted.

The first and second sockets 1240 and 1250, a pair of sockets, are respectively coupled to opposing ends of the cylindrical cover unit including the heat dissipation member 1210 and the cover 1220. For example, the first socket 1240 may include electrode terminals 1241 and a power source device 1242, and dummy terminals 1251 may be disposed on the second socket 1250. Also, an optical sensor and/or a communications module may be installed in either the first socket 1240 or the second socket 1250. For example, the optical sensor and/or the communications module may be installed in the second socket 1250 in which the dummy terminals 1251 are disposed. In another example, the optical sensor and/or the communications module may be installed in the first socket 1240 in which the electrode terminals 1241 are disposed.

The lighting device using the light emitting device may be classified as an indoor lighting device and an outdoor lighting device. Indoor LED lighting devices may be generally provided to replace or retrofit existing lighting devices, and may include bulb type lamps, fluorescent lamps (LED-tubes), and flat type illumination devices. Outdoor LED lighting devices may include street lamps, security lamps, floodlighting lamps, scenery lamps, traffic lights, and the like.

The lighting device using LEDs may be employed as internal or external light sources of vehicles. Internal light sources of vehicles may include interior lights, reading lights, dashboard light sources, and the like. External light sources of vehicles may include various light sources such as headlights, brake lights, turn indicators, fog lights, running lights and the like.

In addition, as light sources used for robots or various mechanical devices, LED lighting devices may be used. In particular, LED lighting devices using specific waveform bands may promote the growth of plants and may stabilize human emotions or treat illnesses in humans.

As set forth above, according to example embodiments the optical device allowing for the miniaturization of a high-capacity package using a large-area chip while significantly reducing optical loss, and the light emitting device package including the optical device may be provided.

While example embodiments have been particularly shown and described above, it will be apparent to those skilled in the art that modifications and variations could be made therein without departing from the scope of the inventive concept as defined by the following claims.

What is claimed is:

1. An optical device comprising:
a first surface having a shape of a quadrangle; and
a second surface disposed to be opposite to the first surface and comprising:
a convex curved surface; and
a concave curved surface extending from an end portion of the second surface toward an optical axis of the optical device,
wherein the optical device has an aspherical shape in a cross-section taken along a diagonal direction of the quadrangle and has a semicircular shape in a cross-section taken along a direction connecting a central portion of a first side of the quadrangle and a central portion of a second side opposite to the first side of the quadrangle, and
wherein the second surface is continuously varied between the semicircular shape of the cross-section and the aspherical shape of the cross-section between the cross-section taken along the direction connecting the central portions of the first and second sides of the quadrangle and the cross-section taken along the diagonal direction of the quadrangle.

2. The optical device of claim 1, wherein the second surface is continuously varied between the semicircular shape of the cross-section and the aspherical shape of the cross-section along a circumference of the optical device.

3. The optical device of claim 1, further comprising a third surface disposed between the first surface and the second surface and connecting the first surface and the second surface to each other,
wherein the third surface extends from an end portion of the first surface in a first direction and is connected to an end portion of the second surface.

4. The optical device of claim 3, wherein the first direction extends in a direction substantially perpendicular to an extending direction of the first surface.

5. The optical device of claim 1, wherein the second surface further comprises a lens part extending from an end of the concave curved surface and having a convexly protruding central portion through which the optical axis passes.

6. The optical device of claim 5, wherein the lens part comprises:
   a curved section having the aspherical shape of the cross-section disposed above the light source; and
   a linear section disposed between the curved section and the concave curved surface, and
   wherein at least a portion of the linear section is disposed above an upper portion of the light source.

7. A light emitting device package comprising:
   a substrate;
   a light source provided on the substrate; and
   an optical device disposed on the substrate to cover the light source,
   wherein the optical device has a dome structure and comprises:
      a first surface having a shape of a quadrangle; and
      a second surface disposed to be opposite to the first surface and having:
         a convex curved surface; and
         a concave curved surface extending from an end portion of the second surface toward an optical axis of the optical device,
      wherein the optical device has an aspherical shape in a cross-section in a diagonal direction of the quadrangle and has a semicircular shape in a cross-section taken along a direction connecting a central portion of a first side of the quadrangle and a central portion of a second side opposite to the first side of the quadrangle, and
      wherein the second surface is continuously varied between the semicircular shape of the cross-section and the aspherical shape of the cross-section between the cross-section taken along the direction connecting the central portions of the first and second sides of the quadrangle and the cross-section taken along the diagonal direction of the quadrangle.

8. The optical device of claim 7, wherein the second surface is continuously varied between the semicircular shape of the cross-section and the aspherical shape of the cross-section along a circumference of the optical device.

9. The light emitting device package of claim 7, wherein the second surface further comprises
   a lens part extending from an end of the concave curved surface and having a convexly protruding central portion through which the optical axis passes.

10. The light emitting device package of claim 9, wherein the second surface comprises an inflection point at a connection point of the lens part and the concave curved surface in a cross-sectional view of the second surface.

11. The light emitting device package of claim 9, wherein in the second surface, a boundary line extends along a plurality of connection points of the lens part and the concave curved surface has a quadrangular shape, the boundary line continuously extending along a perimeter of the second surface, and
   wherein the boundary line comprises a curved edge line and a corner portion of the boundary line comprises a curved corner line.

12. The light emitting device package of claim 9, wherein the lens part comprises:
   a curved section having the aspherical shape of the cross-section disposed above the light source; and
   a linear section disposed between the curved section and the concave curved surface.

13. The light emitting device package of claim 12, wherein the linear section is not disposed above an upper portion of the light source.

14. The light emitting device package of claim 7, further comprising a third surface disposed between the first surface and the second surface and connecting the first surface and the second surface to each other,
   wherein along an outermost edge of the substrate, the third surface extends from an end portion of the first surface and is connected to an end portion of the second surface.

15. The light emitting device package of claim 14, wherein the third surface is coplanar with a side surface of the substrate extending in a thickness direction of the substrate.

16. The light emitting device package of claim 7, wherein the light source comprises:
   a light emitting device configured to emit light; and
   a wavelength conversion layer configured to convert a wavelength of the light emitted by the light emitting device.

17. The light emitting device package of claim 16, wherein the wavelength conversion layer covers an upper surface of the light emitting device and has a cross-sectional area corresponding to or greater than that of an upper surface of the light emitting device.

18. The light emitting device package of claim 16, wherein the wavelength conversion layer comprises at least one or more phosphors.

19. The light emitting device package of claim 7, further comprising a reflective part covering perimeters of side surfaces of the light emitting device.

20. The light emitting device package of claim 19, wherein a height of the reflective part is greater than or equal to a height of the light emitting device mounted on the substrate.

* * * * *